United States Patent
Kaneko et al.

(10) Patent No.: US 11,367,630 B2
(45) Date of Patent: *Jun. 21, 2022

(54) SUBSTRATE CLEANING METHOD, SUBSTRATE CLEANING SYSTEM, AND MEMORY MEDIUM

(71) Applicant: TOKYO ELECTRON LIMITED, Minato-ku (JP)

(72) Inventors: Miyako Kaneko, Nirasaki (JP); Keiji Tanouchi, Nirasaki (JP); Takehiko Orii, Nirasaki (JP); Itaru Kanno, Minato-ku (JP); Meitoku Aibara, Koshi (JP); Satoru Tanaka, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/007,085

(22) Filed: Aug. 31, 2020

(65) Prior Publication Data
US 2020/0395230 A1    Dec. 17, 2020

Related U.S. Application Data

(60) Continuation of application No. 15/904,539, filed on Feb. 26, 2018, now Pat. No. 10,811,283, which is a (Continued)

(30) Foreign Application Priority Data

Nov. 13, 2013 (JP) ................... 2013-234843
Aug. 11, 2014 (JP) ................... 2014-163839

(51) Int. Cl.
*H01L 21/02* (2006.01)
*H01L 21/67* (2006.01)

(52) U.S. Cl.
CPC .... *H01L 21/67051* (2013.01); *H01L 21/0206* (2013.01); *H01L 21/02052* (2013.01); *H01L 21/02057* (2013.01)

(58) Field of Classification Search
None
See application file for complete search history.

(56) References Cited

U.S. PATENT DOCUMENTS 5,910,337 A * 6/1999 Lyons .................... G03F 7/091
                                                          427/259
7,267,130 B2   9/2007 Okuda et al.
(Continued)

FOREIGN PATENT DOCUMENTS

CN    1949086 A     4/2007
JP    02-246332 A  10/1990
(Continued)

*Primary Examiner* — Mikhail Kornakov
*Assistant Examiner* — Ryan L Coleman
(74) *Attorney, Agent, or Firm* — Oblon, McClelland, Maier & Neustadt, L.L.P.

(57) ABSTRACT

A method for cleaning a substrate includes supplying to a substrate on which a resist layer is not formed a film-forming processing liquid which includes a volatile component and forms a film on the substrate, forming a processing film on the substrate by solidifying or curing the film-forming processing liquid supplied on the substrate, and supplying to the substrate having the processing film a strip-processing liquid which strips the processing film from the substrate.

20 Claims, 15 Drawing Sheets

Related U.S. Application Data division of application No. 14/539,174, filed on Nov. 12, 2014, now Pat. No. 9,953,826.

(56) References Cited

U.S. PATENT DOCUMENTS

| | | |
|---|---|---|
| 8,023,099 B2 | 9/2011 | Yamamoto |
| 2002/0062840 A1 | 5/2002 | Verhaverbeke |
| 2002/0092544 A1 | 7/2002 | Namba |
| 2006/0054181 A1 | 3/2006 | Rayandayan et al. |
| 2007/0087456 A1 | 4/2007 | Hashizume |
| 2010/0258142 A1 | 10/2010 | Kawaguchi et al. |
| 2010/0319734 A1 | 12/2010 | Minami |
| 2011/0139188 A1 | 6/2011 | Tsai |
| 2012/0017934 A1 | 1/2012 | Kumon et al. |
| 2012/0214294 A1* | 8/2012 | Kon .................... C11D 7/5013 438/478 |
| 2012/0260949 A1* | 10/2012 | Sekiguchi ......... H01L 21/67051 134/22.19 |
| 2012/0270157 A1* | 10/2012 | Minegishi ................ G03F 7/09 430/323 |
| 2013/0037048 A1 | 2/2013 | Edgington et al. |
| 2014/0041685 A1 | 2/2014 | Kaneko et al. |
| 2014/0144464 A1 | 5/2014 | Kaneko et al. |
| 2014/0144465 A1 | 5/2014 | Kaneko et al. |

FOREIGN PATENT DOCUMENTS

| | | |
|---|---|---|
| JP | 08-318181 A | 12/1996 |
| JP | 10-282637 A | 10/1998 |
| JP | 2000-156362 A | 6/2000 |
| JP | 2001-230318 A | 8/2001 |
| JP | 2003-332288 A | 11/2003 |
| JP | 2006-210598 A | 8/2006 |
| JP | 2007-134689 A | 5/2007 |
| JP | 2007-258462 A | 10/2007 |
| JP | 2008-060368 A | 3/2008 |
| JP | 2010-027786 A | 2/2010 |
| JP | 2012-039155 A | 2/2012 |
| JP | 2012-174775 A | 9/2012 |
| JP | 2013-016599 A | 1/2013 |
| JP | 2013-207077 A | 10/2013 |
| TW | 201104735 A | 2/2011 |

* cited by examiner

SUBSTRATE CLEANING METHOD, SUBSTRATE CLEANING SYSTEM, AND MEMORY MEDIUM

CROSS-REFERENCE TO RELATED APPLICATIONS

The present application is a continuation of U.S. application Ser. No. 15/904,539, filed Feb. 26, 2018, which is a divisional of U.S. application Ser. No. 14/539,174, filed Nov. 12, 2014, now U.S. Pat. No. 9,953,826, issued Apr. 24, 2018, which is based upon and claims the benefit of priority to Japanese Patent Applications No. 2013-234843, filed Nov. 13, 2013, and No. 2014-163839, filed Aug. 11, 2014. The entire contents of these applications are incorporated herein by reference.

BACKGROUND OF THE INVENTION

Field of the Invention

The embodiments disclosed herein relate to a substrate cleaning method, substrate cleaning system and memory medium.

Description of Background Art

There is a cleaning apparatus which removes particles attached to substrates such as silicon wafers and compound semiconductor wafers by using physical force generated when a fluid such as liquid or gas is supplied onto substrate surfaces (see JP H08-318181A). Also, there is another substrate cleaning apparatus which removes particles by supplying a chemical solution such as SC1 to substrate surfaces so as to use chemical reactions (such as etching) of the supplied solution (see JP2007-258462A). The entire contents of these publications are incorporated herein by reference.

SUMMARY OF THE INVENTION

According to one aspect of the present invention, a method for cleaning a substrate includes supplying to a substrate a film-forming processing liquid which includes a volatile component and forms a film on the substrate, vaporizing the volatile component in the film-forming processing liquid such that the film-forming processing liquid solidifies or cures on the substrate and forms a processing film on the substrate, supplying to the substrate having the processing film a strip-processing liquid which strips the processing film from the substrate, and supplying to the processing film formed on the substrate a dissolving-processing liquid which dissolves the processing film after the supplying of the strip-processing liquid.

According to another aspect of the present invention, an apparatus for cleaning a substrate includes a chamber which accommodates a substrate, a substrate holding device which holds the substrate in the chamber, a stripping-processing liquid supply device which supplies a stripping-processing liquid which strips a processing film formed on the substrate such that the stripping-processing liquid is supplied to the processing film formed on the substrate accommodated in the chamber, and a dissolving-processing liquid supply device which supplies a dissolving-processing liquid which dissolves the processing film formed on the substrate such that the dissolving-processing liquid is supplied to the processing film formed on the substrate accommodated in the chamber.

According to yet another aspect of the present invention, a substrate cleaning system includes a loading/unloading station including a carrier mounting device and a transfer device, a processing station connected to the loading/unloading station and including a transfer device and multiple substrate cleaning apparatuses, and a control apparatus which controls the loading/unloading station and the processing station. Each of the substrate cleaning apparatuses in the processing station includes a chamber which accommodates a substrate, a substrate holding device which holds the substrate in the chamber, a stripping-processing liquid supply device which supplies a stripping-processing liquid which strips a processing film formed on the substrate such that the stripping-processing liquid is supplied to the processing film formed on the substrate accommodated in the chamber, and a dissolving-processing liquid supply device which supplies a dissolving-processing liquid which dissolves the processing film formed on the substrate such that the dissolving-processing liquid is supplied to the processing film formed on the substrate accommodated in the chamber.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE EMBODIMENTS

Figure 1A:
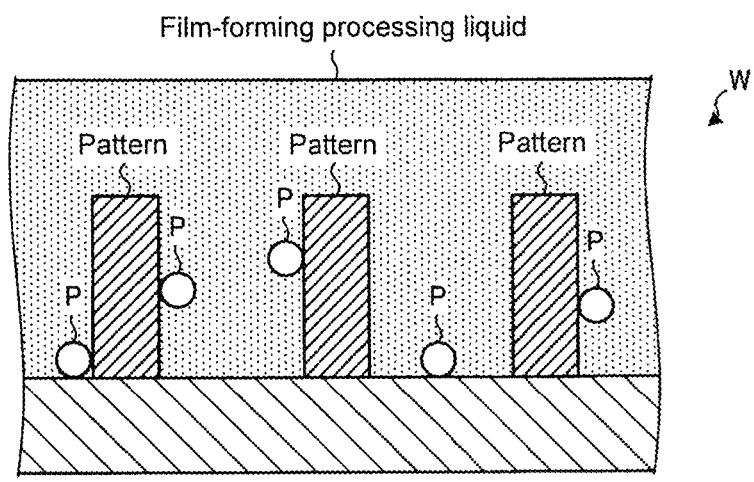
FIG. 1A is a view to illustrate a substrate cleaning method according to a first embodiment.

The embodiments will now be described with reference to the accompanying drawings, wherein like reference numerals designate corresponding or identical elements throughout the various drawings.

First Embodiment

Substrate Cleaning Method

A substrate cleaning method according to a first embodiment is described by referring to FIG. 1A-1E. FIG. 1A-1E are views to illustrate a substrate cleaning method of the first embodiment.

In a substrate cleaning method of the first embodiment, a processing liquid that contains a volatile component and forms a film on a wafer (W) (hereinafter referred to as a "film-forming liquid") is supplied to the patterned surface of a substrate such as a silicon wafer or a compound semiconductor wafer (hereinafter referred to as a "wafer (W)"), as shown in FIG. 1A.

The patterned surface of a wafer (W) is made hydrophilic by, for example, coating a hydrophilic film (not shown) or by conducting hydrophilization treatment using ozone water or the like.

The film-forming liquid supplied to the patterned surface of a wafer (W) solidifies or cures while undergoing volume contraction caused by vaporization of the volatile component so that a processing film is formed. Accordingly, patterns formed on the wafer (W) and particles (P) attached to the patterns are covered by the processing film (see FIG. 1B). Here, "to solidify" means a liquid becomes a solid state, and "to cure" means molecules are bonded to each other and become a polymer (such as crosslinking, polymerization or the like).

Figure 1B:
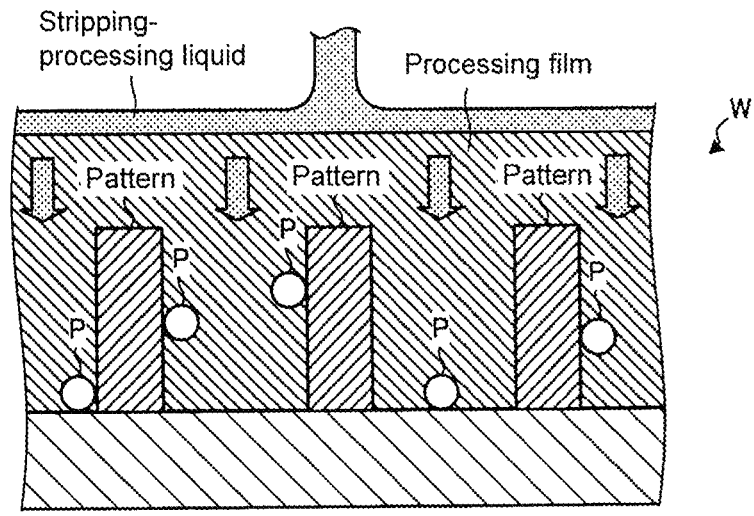
FIG. 1B is a view to illustrate a substrate cleaning method according to the first embodiment.

As shown in FIG. 1B, a stripping-processing liquid is supplied to the processing film on the wafer (W). A stripping-processing liquid is used to strip the processing film from the wafer (W).

In particular, a stripping-processing liquid is a hydrophilic treatment liquid, and when it is supplied on the processing film, it infiltrates the processing film and reaches the interface of a wafer (W). Since the interface of a wafer (W) where patterns are formed is hydrophilic, the stripping-processing liquid that has reached the interface of the wafer (W) infiltrates the patterned surface on the interface of the wafer (W).

Figure 1C:
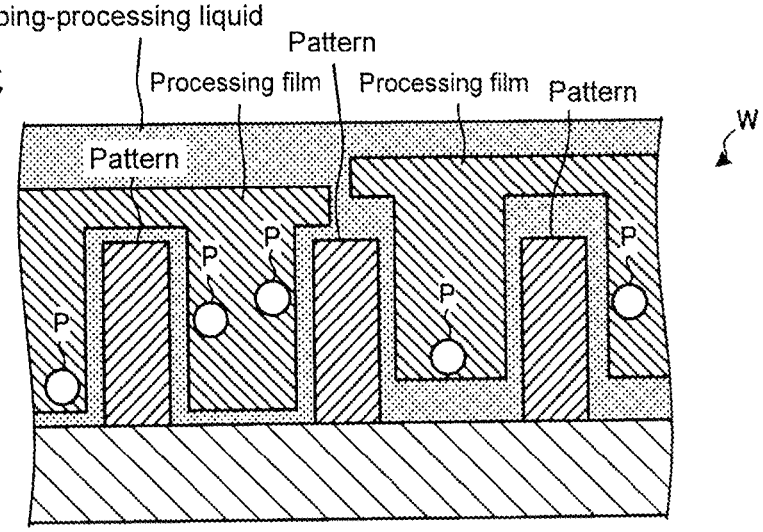
FIG. 1C is a view to illustrate a substrate cleaning method according to the first embodiment.
Figure 1D:
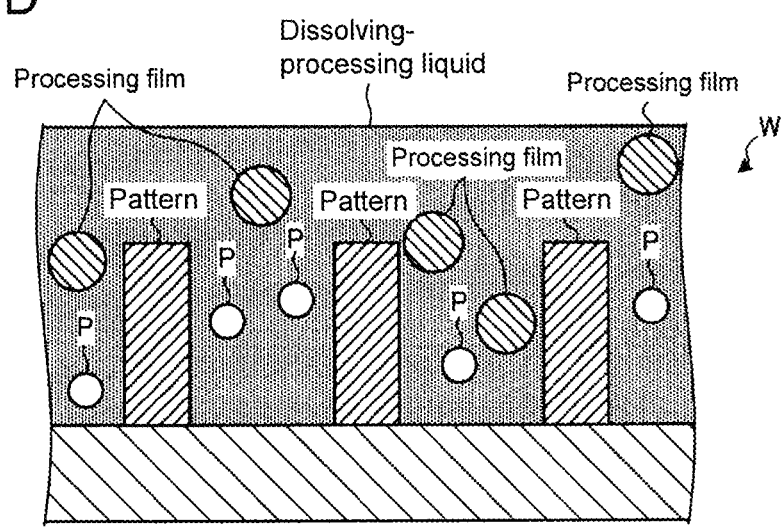
FIG. 1D is a view to illustrate a substrate cleaning method according to the first embodiment.
Figure 1E:
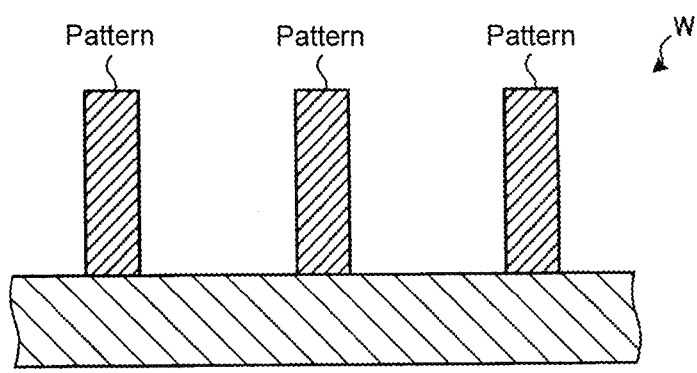
FIG. 1E is a view to illustrate a substrate cleaning method according to the first embodiment.

When the stripping-processing liquid infiltrates between the wafer (W) and the processing film, the processing film is stripped from the wafer (W) in a state of "film." Accordingly, particles (P) attached to the patterned surface are also stripped from the wafer (W) along with the processing film (see FIG. 1C).

Particles (P) attached to the patterns or the like are stripped from the patterns by a film-forming liquid through strain (tensile force) caused by volume contraction that occurs when the volatile component is vaporized.

A dissolving-processing liquid capable of dissolving a processing film is supplied to the processing film stripped from the wafer (W). Accordingly, the processing film dissolves and particles (P) captured by the processing film float in the dissolving-processing liquid (see FIG. 1D). Then, particles (P) are removed from the wafer (W) when the dissolving-processing liquid and the dissolved processing film are rinsed off by pure water or the like (see FIG. 1E).

In the substrate cleaning method according to the first embodiment, the processing film formed on a wafer (W) is stripped from the wafer (W) in a state of "film" so that particles (P) attached to the patterns or the like are removed from the wafer (W) along with the processing film.

According to the substrate cleaning method of the first embodiment, since particles are removed without using chemical reactions, erosion of the base layer caused by etching or the like is suppressed.

According to the substrate cleaning method of the first embodiment, since particles (P) are removed using weaker force compared with a substrate cleaning method that uses physical force, collapse of patterns is also suppressed.

Using the substrate cleaning method of the first embodiment, removal of particles (P) is facilitated for those having a smaller particle diameter which are difficult to remove by a substrate cleaning method that uses physical force. Such an effect is described later using the comparison results of particle removal rates between the substrate cleaning method of the first embodiment and a substrate cleaning method using physical force (see FIG. 5).

According to the substrate cleaning method of the first embodiment, a processing film is formed on a wafer (W) and then is completely removed from the wafer (W) without conducting pattern exposure. Thus, after the cleaning processing, the patterned surface of a wafer (W) returns to the state it had before the film-forming liquid was coated, namely, a state where the patterned surface is exposed.

Substrate Cleaning System

Figure 2:
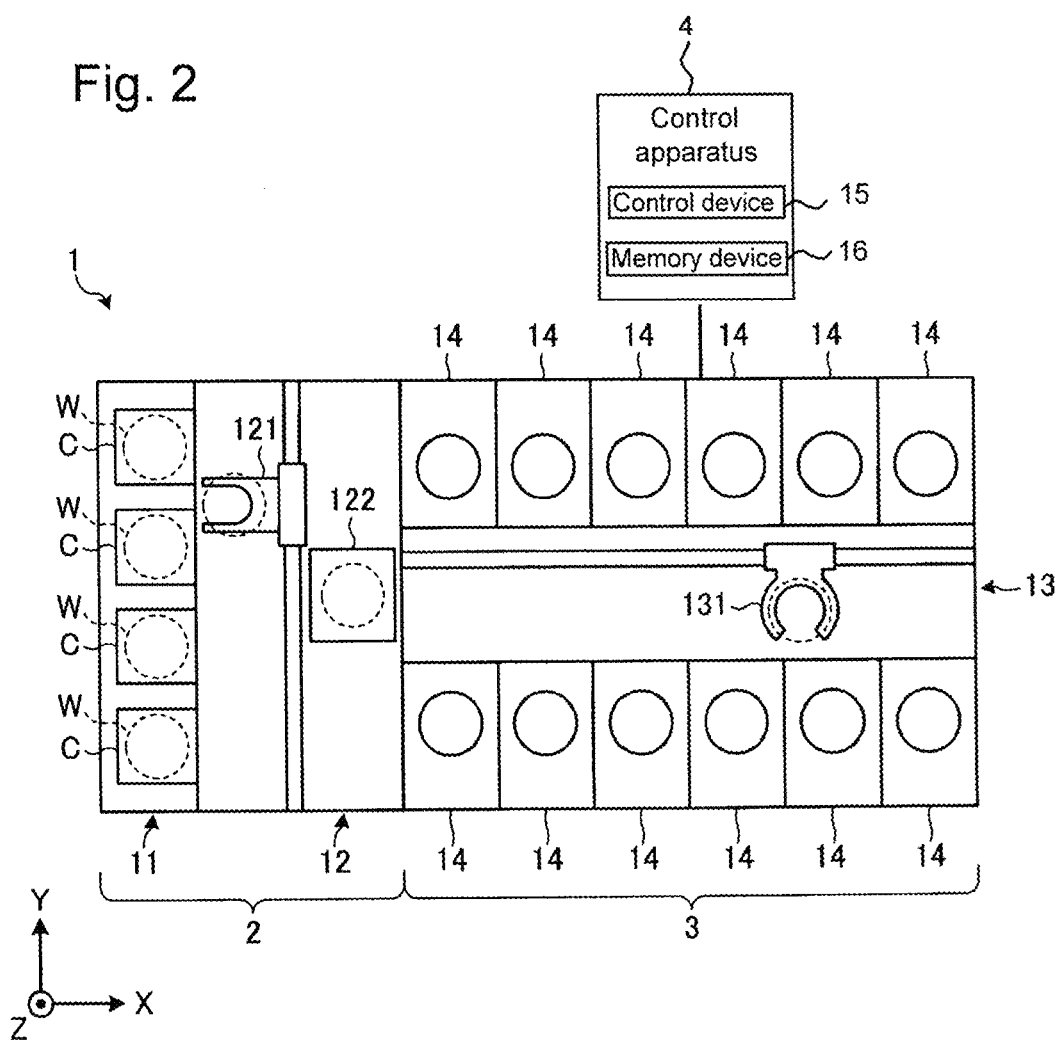
FIG. 2 is a view schematically showing the structure of a substrate cleaning system according to the first embodiment.

The structure of a substrate cleaning system of the first embodiment is described with reference to FIG. 2. FIG. 2 is a view schematically showing the structure of a substrate cleaning system of the first embodiment. In the following, to clarify the positional relationships, axes (X, Y, Z) vertically intersecting each other are defined, where the positive direction of axis (Z) is set in a vertically upward direction.

As shown in FIG. 2, substrate cleaning system 1 has loading/unloading station 2 and processing station 3. Loading/unloading station 2 and processing station 3 are positioned next to each other.

Loading/unloading station 2 includes carrier mounting section 11 and transfer section 12. Multiple transfer containers (hereinafter referred to as a "carrier (C)") capable of horizontally accommodating multiple wafers (W) are positioned in carrier mounting section 11.

Transfer section 12 is positioned adjacent to carrier mounting section 11. Substrate transfer device 121 and delivery device 122 are provided in transfer section 12.

Substrate transfer device 121 has a wafer holding mechanism for holding a wafer (W). Also, substrate transfer device 121 is capable of moving in horizontal and vertical directions as well as rotating around the vertical axis, and transfers a wafer (W) between carrier (C) and delivery device 122 using the wafer holding mechanism.

Processing station 3 is provided next to transfer section 12. Processing station 3 has transfer section 13 and multiple substrate cleaning apparatuses 14. Multiple substrate cleaning apparatuses 14 are arrayed along both sides of transfer section 13.

Substrate transfer device 131 is provided in transfer section 13. Substrate transfer device 131 has a wafer holding mechanism for holding a wafer (W). In addition, substrate transfer device 131 is capable of moving in horizontal and vertical directions as well as rotating around the vertical axis, and transfers a wafer (W) between delivery device 122 and substrate cleaning apparatus 14 using the wafer holding mechanism.

Substrate cleaning apparatus 14 performs a substrate cleaning processing according to the above-described substrate cleaning method. The detailed structure of substrate cleaning apparatus 14 will be described later.

Substrate cleaning system 1 has control apparatus 4. Control apparatus 4 controls operations in substrate cleaning system 1. Control apparatus 4 is a computer, for example, and is equipped with control device 15 and memory device 16. Programs are stored in memory device 16 to control various processings such as a substrate cleaning processing or the like. Control device 15 controls operations conducted in substrate cleaning system 1 by reading out and executing the program stored in memory device 16.

The program may be such that is stored in a memory medium readable by a computer and is installed from the memory medium into memory device 16 of control apparatus 4. Examples of memory media readable by a computer are a hard disc (HD), flexible disc (FD), compact disc (CD), magneto-optical disc (MO), memory card and the like.

In substrate cleaning system 1 structured as above, first, substrate transfer device 121 of loading/unloading station 2 unloads a wafer (W) from carrier (C) and mounts the unloaded wafer (W) on delivery device 122. The wafer (W) mounted on delivery device 122 is unloaded from delivery device 122 by substrate transfer device 131 of processing station 3 and is loaded into substrate cleaning apparatus 14. Then, substrate cleaning processing is performed on the wafer (W) by substrate cleaning apparatus 14. The cleaned wafer (W) is unloaded from substrate cleaning apparatus 14 by substrate transfer device 131, mounted on delivery device 122 and returned to carrier (C) by substrate transfer device 121.

Substrate Cleaning Apparatus

Figure 3:
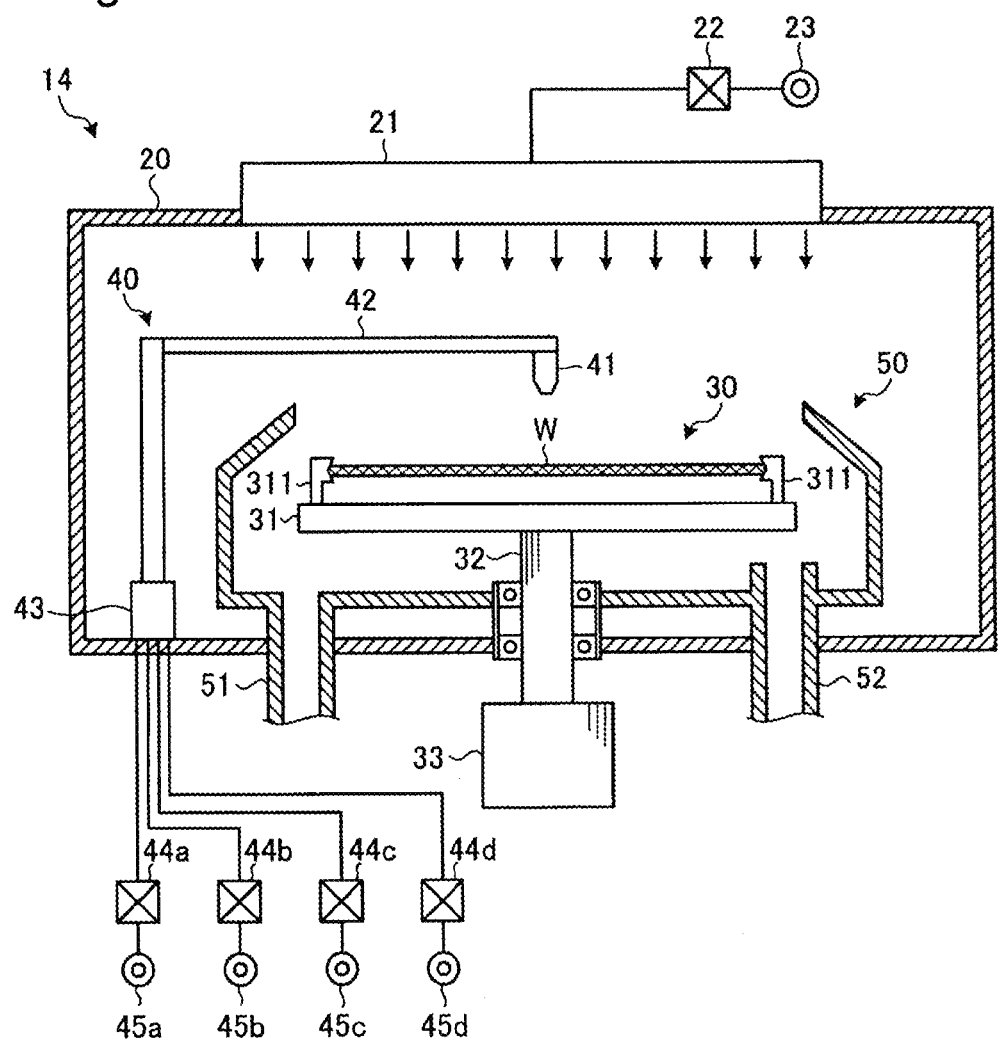
FIG. 3 is a view schematically showing the structure of a substrate cleaning apparatus according to the first embodiment.

The structure of substrate cleaning apparatus 14 is described by referring to FIG. 3. FIG. 3 is a view schematically showing the structure of substrate cleaning apparatus 14 of the first embodiment.

As shown in FIG. 3, substrate cleaning apparatus 14 is equipped with chamber 20, substrate holding mechanism 30, liquid supply device 40 and collection cup 50.

Chamber 20 has substrate holding mechanism 30, liquid supply device 40 and collection cup 50. On the ceiling section of chamber 20, a fan filter unit (FFU) 21 is provided. FFU 21 produces a downflow in chamber 20.

FFU 21 is connected to downflow-gas supply source 23 via valve 22. FFU 21 discharges a downflow gas (such as dry air) supplied from downflow-gas supply source 23 into chamber 20.

Substrate holding mechanism 30 is formed with rotation holding section 31, support column 32 and driver device 33. Rotation holding section 31 is positioned in the approximate center of chamber 20. Holding member 311 is provided on the upper surface of rotation holding section 31 so as to hold the sides of a wafer (W). A wafer (W) is horizontally held by holding member 311 while it is slightly separated from the upper surface of rotation holding section 31.

Support column 32 is a member extending in a vertical direction, and its base portion is supported to be rotatable by driver device 33 and its tip portion horizontally supports rotation holding section 31. Driver device 33 rotates support column 32 around the vertical axis.

Substrate holding mechanism 30 rotates support column 32 by using driver device 33 to rotate rotation holding section 31 supported by support column 32. A wafer (W) held at rotation holding section 31 rotates accordingly.

Liquid supply device 40 supplies various processing liquids to a wafer (W) held by substrate holding mechanism 30. Liquid supply device 40 is equipped with nozzle 41, arm 42 to horizontally support nozzle 41, and rotatable elevator mechanism 43 to rotate, elevate and lower arm 42.

Nozzle 41 is connected to ozone water supply source (45a), topcoat liquid supply source (45b), DIW supply source (45c) and alkali developing solution supply source (45d) respectively through valves (44a~44d). DIW is pure water at normal temperature (approximately 23~25 degrees). In the present embodiment, there is one nozzle 41 provided in the liquid supply device. However, there may be two or more nozzles. For example, four nozzles may be provided to individually supply different types of processing liquids.

Liquid supply device 40 is structured as above, and supplies ozone water, topcoat liquid, DIW or alkali developing solution to a wafer (W).

Ozone water is an example of a hydrophilization treatment liquid to provide hydrophilic properties for the patterned surface of a wafer (W). Instead of ozone water, a hydrogen-peroxide solution may also be used as a hydrophilization treatment liquid. In addition, hydrophilization treatment may be conducted by other methods, for example, coating a hydrophilic film such as top anti-reflective coating (TARC), ashing, UV irradiation, attaching a hydrophilic group to a monomolecular layer or the like.

A topcoat solution is an example of a film-forming liquid that forms a topcoat film on a wafer (W). A topcoat film is a protective film to be coated on the upper surface of a resist layer so as to prevent an immersion liquid from infiltrating the resist layer. An immersion liquid is used in immersion exposure in a lithographic process, for example.

DIW is an example of a stripping-processing liquid for stripping a topcoat film from a wafer (W). DIW is also used as a rinsing-treatment liquid in a rinsing process conducted after the later-described dissolving-processing liquid supply process.

An alkali developing solution is an example of a dissolving-processing liquid to dissolve a topcoat film. An example of an alkali developing solution is not limited specifically as long as it contains at least one of quaternary ammonium hydroxide solutions such as aqueous ammonium and tetra methyl ammonium hydroxide (TMAH), and choline-based solutions.

Collection cup 50 is positioned to surround rotation holding section 31, and collects processing liquid being scattered from a wafer (W) when rotation holding section 31 rotates. Drain port 51 is formed at the bottom of collection cup 50, and the processing liquid collected by collection cup 50 is drained from drain port 51 to the outside of substrate cleaning apparatus 14. In addition, exhaust port 52 is also formed at the bottom of collection cup 50 to exhaust a downflow gas supplied from FFU 21 to the outside of substrate cleaning apparatus 14.

Procedures for Substrate Cleaning System

Figure 4:
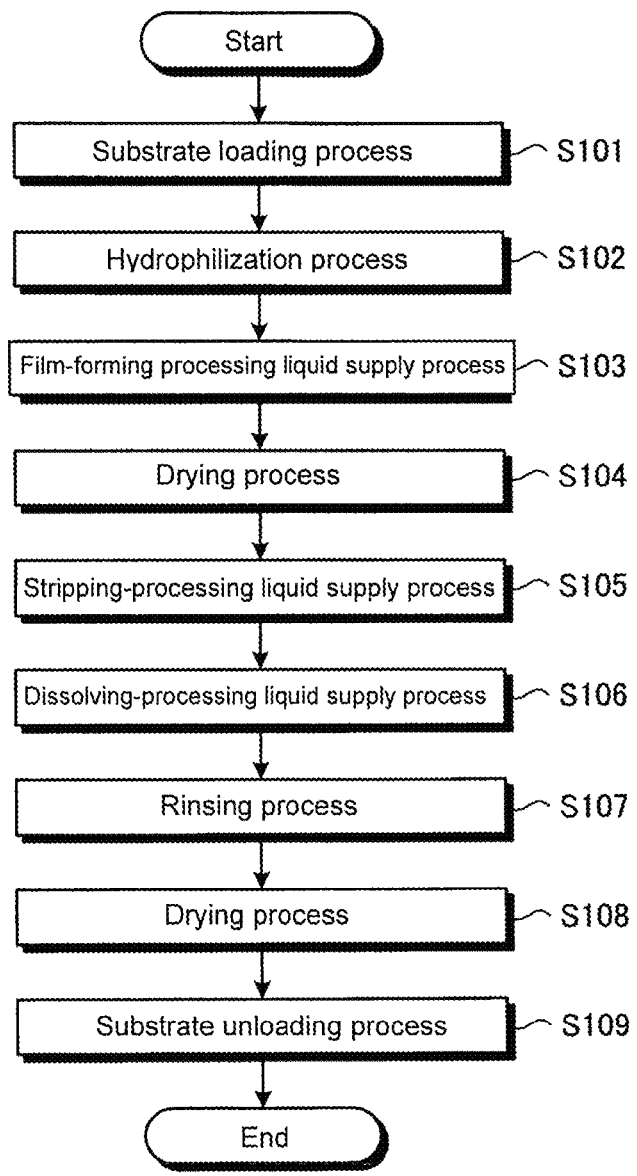
FIG. 4 is a flowchart showing procedures for a substrate cleaning processing carried out by a substrate cleaning apparatus of the first embodiment.

Detailed procedures conducted by substrate cleaning apparatus 14 are described with reference to FIG. 4. FIG. 4 is a flowchart showing procedures for a substrate cleaning processing conducted by substrate cleaning system 1 of the first embodiment.

As shown in FIG. 4, first, a substrate loading process is conducted in substrate cleaning apparatus 14 (step S101). In the substrate loading process, a wafer (W) loaded into chamber 20 by substrate transfer device 131 (see FIG. 2) is held by holding member 311 of substrate holding mechanism 30. At that time, the wafer (W) is held by holding member 311 in such a way that the patterned surface faces upward. Then, rotation holding section 31 is rotated by driver device 33. Accordingly, the wafer (W) also rotates with rotation holding section 31 while it is held horizontally by rotation holding section 31.

A hydrophilization process is conducted in substrate cleaning apparatus 14 (step S102). In the hydrophilization process, nozzle 41 of liquid supply device 40 is positioned above the central portion of a wafer (W). Then, ozone water as a hydrophilization treatment liquid is supplied to the patterned surface of a wafer (W) where no resist is formed. Ozone water supplied to the wafer (W) is spread on the patterned surface of the wafer (W) by centrifugal force generated by the rotation of the wafer (W). Accordingly, the patterned surface of the wafer (W) becomes hydrophilic.

When the patterned surface of a wafer (W) is already hydrophilic, the above hydrophilization treatment may be skipped.

In substrate cleaning apparatus 14, a film-forming liquid supply process is conducted (step S103). In the film-forming liquid supply process, a topcoat solution as a film-forming liquid is supplied to the patterned surface of the wafer (W) where no resist is formed. As described, the topcoat solution is supplied to the wafer (W) without a resist layer disposed between them.

The topcoat solution supplied to the wafer (W) is spread on the surface of the wafer (W) by centrifugal force generated by the rotation of the wafer (W). Then, the topcoat solution solidifies or cures while it undergoes volume contraction as its volatile component vaporizes, and a liquid film of the topcoat solution is thereby formed on the patterned surface of the wafer (W).

A topcoat solution contains acrylic resin with a property to cause volume contraction when it solidifies or cures. Thus, since volume contraction occurs not only from vaporization of the volatile component but also from curing contraction of acrylic resin, the volume contraction rate is greater than that of a film-forming liquid containing only a volatile component. Accordingly, particles (P) are removed by stronger force. Especially, since acrylic resin has a greater volume contraction rate than other resins such as epoxy resins, the topcoat solution is effective in providing tensile force to particles (P).

Before supplying a topcoat solution to a wafer (W), substrate cleaning apparatus 14 may also supply a solvent such as MIBC (4-methyl-2-pentanol) that has affinity with the topcoat solution. By so doing, wettability is enhanced on the patterned surface of a wafer (W), and it is even easier to spread a topcoat solution on the patterned surface of the wafer (W). Thus, the feed amount of a topcoat solution decreases and the processing duration is shortened.

Next, a drying process is conducted in substrate cleaning apparatus 14 (step S104). In the drying process, the topcoat solution is dried, for example, by increasing the rotation rate of the wafer (W) for a certain duration. Accordingly, vaporization of the volatile component in the topcoat solution is accelerated so that the topcoat solution solidifies or cures to form a topcoat film on the patterned surface of the wafer (W).

As for the drying process in step (S104), it is an option to decompress the inside of chamber 20 by using a vacuum device (not shown), or to lower the humidity in chamber 20 by using a downflow gas supplied from FFU 21. Using such procedures, vaporization of the volatile component is accelerated.

The example above shows how to accelerate vaporization of the volatile component. However, a wafer (W) may be held in substrate cleaning apparatus 14 until the topcoat solution naturally solidifies or cures. Alternatively, vaporization of the volatile component may be accelerated by stopping the rotation of a wafer (W), or by rotating a wafer (W) at a rotation rate that will not cause the topcoat solution to spin off and expose the surface of the wafer (W).

A stripping-processing liquid supply process is conducted in substrate cleaning apparatus 14 (step S105). In the stripping-processing liquid supply process, DIW as a stripping-processing liquid is supplied to the topcoat film formed on the wafer (W). DIW supplied to the topcoat film is spread over the topcoat film by centrifugal force generated by the rotation of the wafer (W).

DIW infiltrates the topcoat film and reaches the interface of the wafer (W). Then, DIW infiltrates the interface (patterned surface) of the wafer (W), which is set to be hydrophilic through the hydrophilization treatment conducted in step (S102), and strips the topcoat film from the wafer (W). Accordingly, particles (P) attached to the patterned surface are stripped from the wafer (W) along with the topcoat film.

A dissolving-processing liquid supply process is conducted in substrate cleaning apparatus 14 (step S106). In the dissolving-processing liquid supply process, an alkali developing solution as a dissolving-processing liquid is supplied to the topcoat film stripped from the wafer (W). Accordingly, the topcoat film is dissolved.

When an alkali developing solution is used as a dissolving-processing liquid, zeta potential of the same polarity is generated on a wafer (W) and particles (P). Accordingly, the wafer (W) and particles (P) repel each other, preventing particles (P) from reattaching to the wafer (W).

A rinsing process is conducted in substrate cleaning apparatus 14 (step S107). In the rinsing process, DIW is supplied to the rotating wafer (W) so that the dissolved topcoat film and particles (P) floating in the alkali developing solution are removed from the wafer (W) when rinsed with DIW.

A drying process is conducted in substrate cleaning apparatus 14 (step S108). In the drying process, the wafer (W) is dried when the rotation rate of the wafer (W) is increased for certain duration to cause the DIW remaining on the surface of the wafer (W) to spin off. Then, the rotation of the wafer (W) is turned off.

A substrate unloading process is conducted in substrate cleaning apparatus 14 (step S109). In the substrate unloading process, the wafer (W) is unloaded by substrate transfer device 131 (see FIG. 2) from chamber 20 of substrate cleaning apparatus 14. Then, the wafer (W) goes through delivery device 122 and substrate transfer device 121 to be finally accommodated in carrier (C) positioned in carrier mounting section 11. When such a substrate unloading process is finished, a substrate cleaning processing on a wafer (W) is completed.

Comparison with Cleaning Method Using Physical Force

Figure 5A:
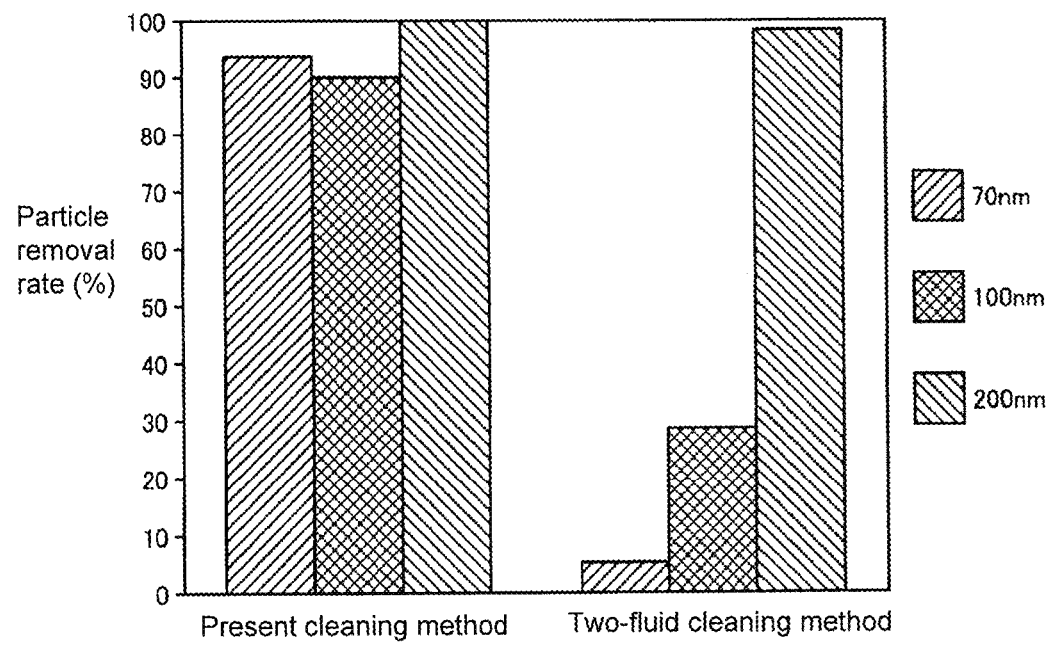
FIG. 5A is a graph showing the results of comparing a cleaning method of the embodiment and two-fluid cleaning.
Figure 5B:
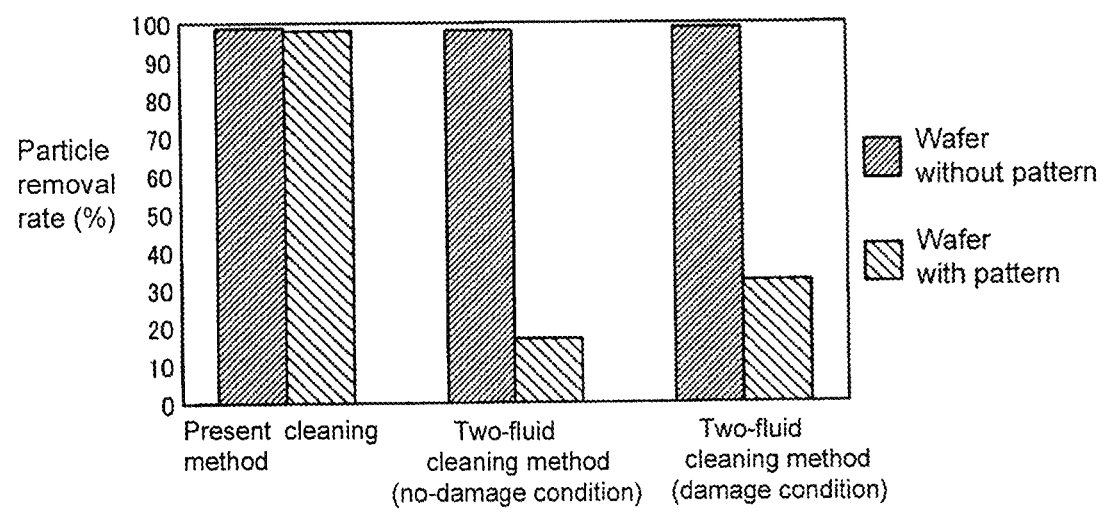
FIG. 5B is a graph showing the results of comparing a cleaning method of the embodiment and two-fluid cleaning.

In the following, a two-fluid cleaning method using physical force and a substrate cleaning method according to the first embodiment (hereinafter referred to as a "present cleaning method") are compared and the results are described by referring to FIGS. 5A and 5B. FIGS. 5A and 5B are graphs showing the results of comparing the present cleaning method and a two-fluid cleaning method.

$SiO_2$ particles with different particle diameters were attached to bare silicon wafers respectively and the wafers were cleaned. FIG. 5A shows comparison results of the particle removal rates by each cleaning method.

FIG. 5B shows comparison results of particle removal rates when a two-fluid cleaning method and the present cleaning method were conducted respectively on wafers where 0.5 µm-high and 0.5 µm-wide patterns are formed at 1.0 µm intervals.

The capability of removing particles (P) having a smaller particle diameter is described with reference to FIG. 5A. In FIG. 5A, the results of particle removal rates when particles (P) have a particle diameter of 70 nm are shown by diagonal hatching lines downward to the left, the results when the diameter is 100 nm are shown with cross hatching, and the results when the diameter is 200 nm are shown with diagonal hatching lines downward to the right.

As shown in FIG. 5A, when a two-fluid cleaning method was used, the particle removal rate was almost 100% when the particle diameter of particles (P) was 200 nm. However, the removal rates showed a significant decrease as the particle diameter was reduced; for example, the rates were approximately 30% when the diameter was 100 nm and approximately 5% when the diameter was 70 nm. From the results, removing particles (P) with a smaller particle diameter is found to be difficult when using a two-fluid cleaning method.

By contrast, regardless of the particle diameters of particles (P), high particle removal rates of approximately 90~100% were observed when the present cleaning method was employed. Accordingly, it is found that the present cleaning method is capable of removing particles (P) having a smaller particle diameter, which are hard to remove using a two-fluid cleaning method.

The capability of removing particles (P) located among patterns is described by referring to FIG. 5B. Using particles (P) having a particle diameter of 200 nm, FIG. 5B shows the results of removal rates by each cleaning method under "no damage conditions" and "damage conditions."

"No damage conditions" indicate that a 2 nm-thick thermal oxidation layer is formed on a wafer and 100 nm-high and 45 nm-wide poly-Si patterns are formed on the thermal oxidation layer, and then cleaning is conducted using a predetermined level of force that will not cause collapse of the poly-Si patterns. "Damage conditions" indicate cleaning is conducted using a predetermined level of force that will cause pattern collapse of the above sample patterns.

In FIG. 5B, the removal rates of particles from wafers without patterns are shown by diagonal hatching lines downward to the left, whereas the removal rates of particles from wafers with patterns are shown by diagonal hatching lines downward to the right. Regarding the present cleaning method, since no collapse of sample patterns occurred, only the results under "no damage conditions" are shown.

As shown in FIG. 5B, when wafers without patterns were cleaned by the present cleaning method, two-fluid cleaning (no damage conditions) and two-fluid cleaning (damage conditions), particle removal rates were each almost 100%. No significant difference was observed between the cleaning methods.

On the other hand, compared with the results on wafers without patterns, a significant decrease in removal rates was observed when a two-fluid cleaning method was used on wafers having patterns; for example, particle removal rates were approximately 17% under no damage conditions and approximately 32% under damage conditions. As found, since removal rates of particles from wafers having patterns significantly decreased compared with removal rates from wafers without patterns, it is found that particles (P) located among patterns are less likely to be removed by two-fluid cleaning.

By contrast, even when a wafer had patterns, the present cleaning method showed the same removal rate of almost 100% as that shown when a wafer had no patterns. Since hardly any difference was observed in particle removal rates between a wafer with patterns and a wafer without patterns, it is found that particles located among patterns were appropriately removed by the present cleaning method.

Compared with two-fluid cleaning, patterns are less likely to collapse while particles located among patterns are appropriately removed according to the present cleaning method.

Comparison with Cleaning Method Using Chemical Reactions

Figure 6A:
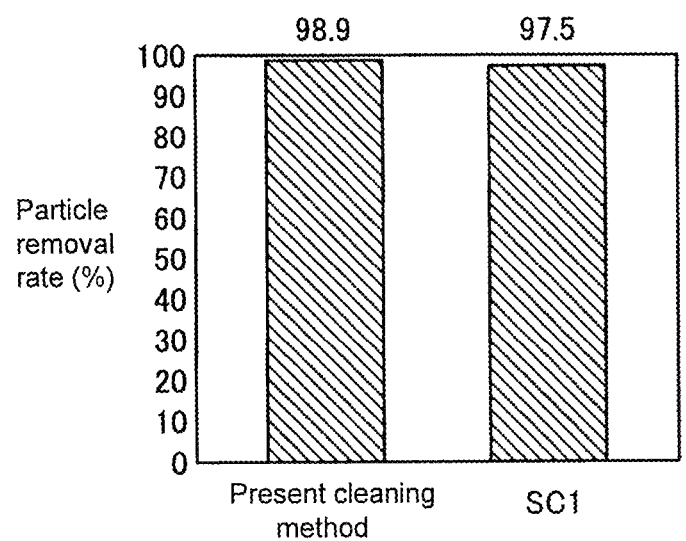
FIG. 6A is a graph showing the results of comparing a cleaning method of the embodiment and chemical cleaning.
Figure 6B:
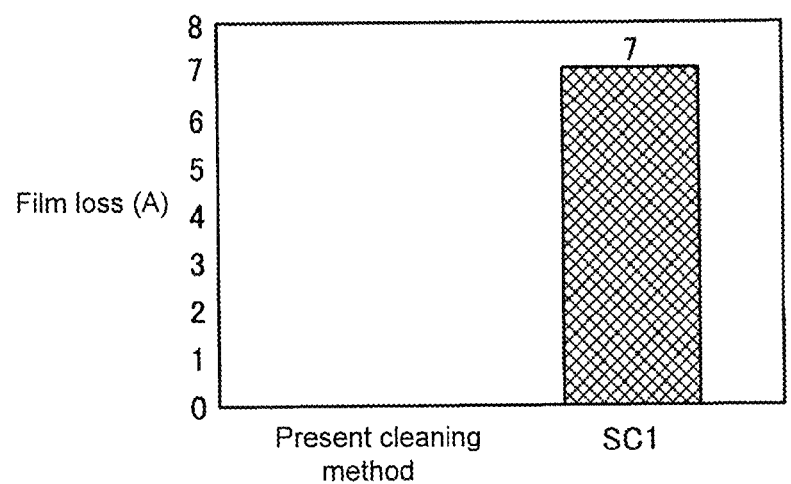
FIG. 6B is a graph showing the results of comparing a cleaning method of the embodiment and chemical cleaning.

Chemical cleaning by SC1 (a mixture of ammonia and hydrogen peroxide) as a cleaning method using chemical reactions is described by comparison with the present cleaning method. FIGS. 6A and 6B are graphs showing the results of comparing the present cleaning method and chemical cleaning. FIG. 6A shows the comparison results of particle removal rates and FIG. 6B shows the comparison results of film loss. Film loss indicates the erosion depth of the thermal oxidation layer which is the base layer formed on a wafer.

For chemical cleaning, SC1 prepared by mixing aqueous ammonia, hydrogen-peroxide and water at a ratio of 1:2:40 was used to conduct cleaning under conditions of temperature at 60° C. and feeding time of 600 seconds. On a wafer, 0.5 µm-high and 0.5 µm-wide patterns were formed at 1.0 µm intervals. The particle diameter of particles (P) was 200 nm.

As shown in FIG. 6A, the particle removal rate by chemical cleaning was 97.5%, which was slightly lower than the particle removal rate (98.9%) by the present cleaning method, but it was found that particles (P) located among patterns were observed to be appropriately removed, unlike the results when the above-described two-fluid cleaning method was employed.

On the other hand, as shown in FIG. 6B, film loss of 7A (Angstrom) was observed as a result of chemical cleaning, while no film loss was observed as a result of the present cleaning method. Therefore, it is found that the present cleaning method is capable of removing particles (P) located among patterns without causing erosion of the base layer.

As described so far, compared with cleaning using physical force or cleaning through chemical reactions, the present cleaning method is even more effective, since it is capable of appropriately removing particles (P) with a smaller particle diameter and particles (P) located among patterns while not affecting the surface of a substrate by damage such as pattern collapse or erosion of the base layer.

As described above, substrate cleaning system 1 of the first embodiment has a film-forming liquid supply device (liquid supply device 40), a stripping-processing liquid supply device (liquid supply device 40), and a dissolving-processing liquid supply device (liquid supply device 40). To a wafer with a hydrophilic surface, the film-forming liquid supply device supplies a film-forming liquid (topcoat solution) that contains a volatile component and forms a film on a wafer (W). To the film-forming liquid (topcoat film) that has solidified or cured on a wafer (W) when its volatile component was vaporized, the stripping-processing liquid supply device supplies a stripping-processing liquid (DIW) to strip the film-forming liquid (topcoat film) from the wafer (W). Then, to the solidified or cured film-forming liquid (topcoat film), the dissolving-processing liquid supply device supplies a dissolving-processing liquid (alkali developing solution) to dissolve the film-forming liquid (topcoat film).

According to substrate cleaning system 1 of the first embodiment, particles (P) with a smaller particle diameter attached to a wafer (W) are removed without affecting the surface of the substrate.

Second Embodiment

In the above-described first embodiment, pure water was used as a stripping-processing liquid. However, a stripping-processing liquid is not limited to pure water. For example, an alkali developing solution with a concentration lower than that of the alkali developing solution as a dissolving-processing liquid may also be used as a stripping-processing liquid.

Figure 7:
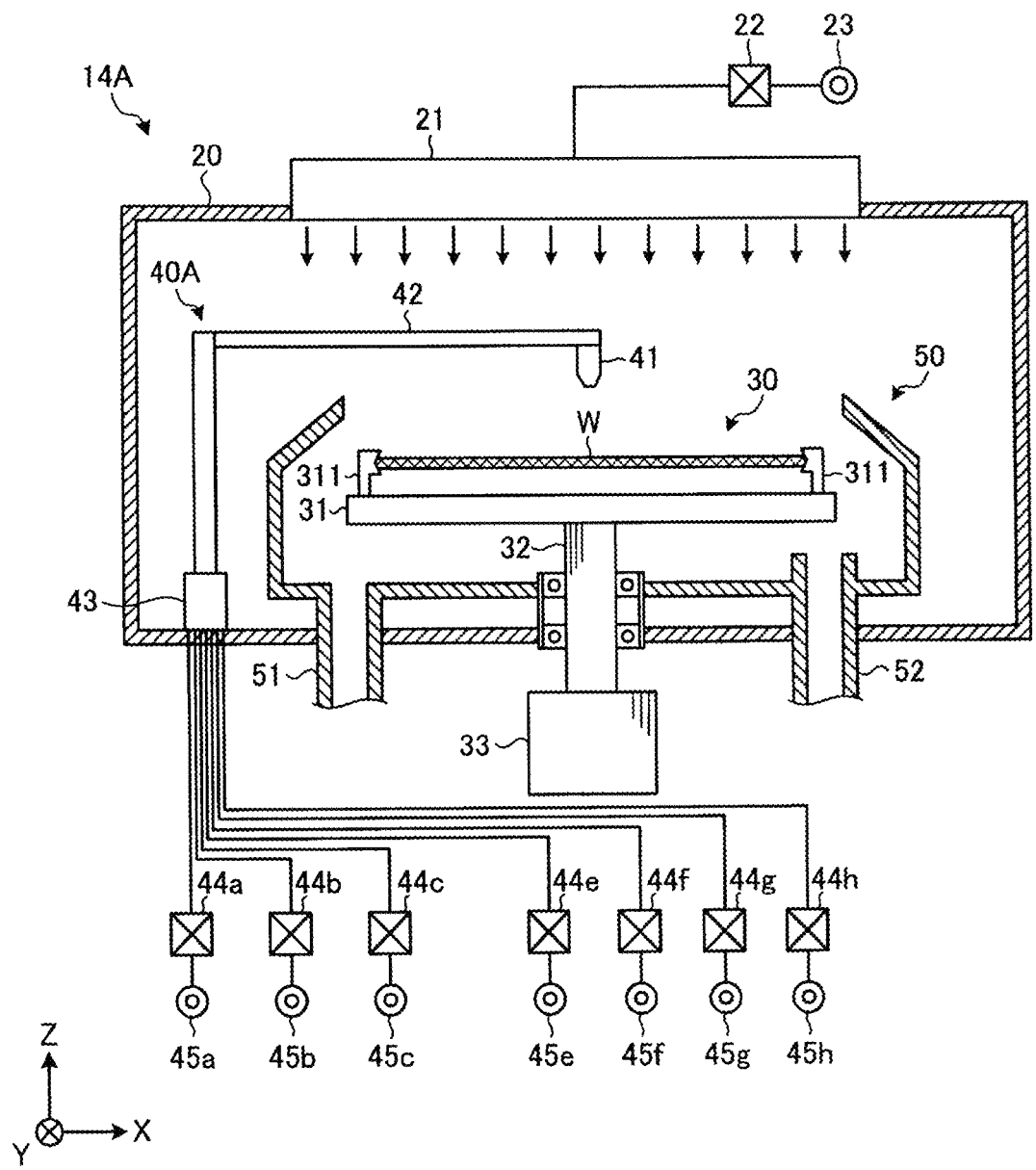
FIG. 7 is a view schematically showing the structure of a substrate cleaning apparatus according to a second embodiment.

FIG. 7 is a view schematically showing the structure of a substrate cleaning apparatus according to a second embodiment. In the following, a portion corresponding or identical to that already described above is assigned with the same reference numeral as above, and its redundant description is omitted here.

As shown in FIG. 7, in substrate cleaning apparatus (14A) of the second embodiment, liquid supply device (40A) is connected to first alkali developing solution supply source (45e), second alkali developing solution supply source (45f), third alkali developing solution supply source (45g) and fourth alkali developing solution supply source (45h) respectively via valves (44e-44h).

First alkali developing solution supply source (45e) supplies an alkali developing solution with a first concentration (0.1%, for example) to liquid supply device (40A), and second alkali developing solution supply source (45f) supplies an alkali developing solution with a second concentration (0.5%, for example) to liquid supply device (40A). In addition, third alkali developing solution supply source (45g) supplies an alkali developing solution with a third concentration (1.0%, for example) to liquid supply device (40A), and fourth alkali developing solution supply source (45h) supplies an alkali developing solution with a fourth concentration (2.38%, for example) to liquid supply device (40A). In the present embodiment, there is one nozzle 41 in the liquid supply device. However, two or more nozzles may be provided. For example, it is an option to provide four nozzles for supplying different types of processing liquids individually. In such a structure, alkali developing solutions with different first to fourth concentrations are supplied by using one of those nozzles and by switching valves (44e-44h).

Figure 8:
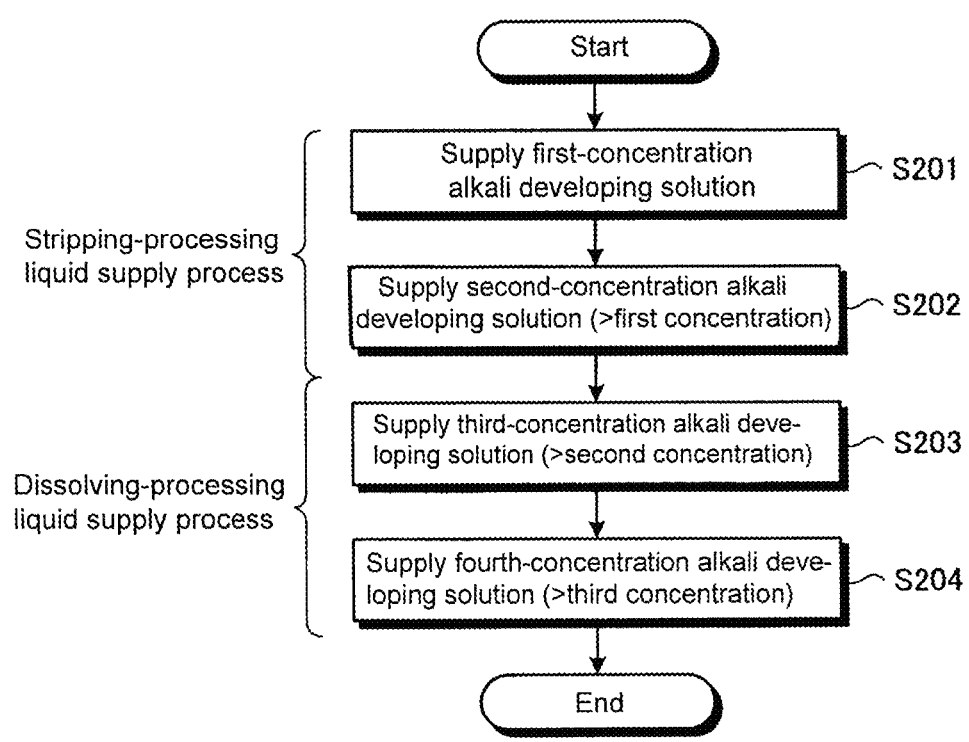
FIG. 8 is a flowchart showing procedures for a substrate cleaning processing carried out by a substrate cleaning apparatus of the second embodiment.

Specific procedures conducted in substrate cleaning apparatus (14A) of the second embodiment are described by referring to FIG. 8. FIG. 8 is a flowchart showing the procedures for a substrate cleaning processing performed by substrate cleaning apparatus (14A) of the second embodiment. FIG. 8 shows only a stripping-processing liquid supply process and a dissolving-processing liquid supply process. Since other procedures are the same as those in the first embodiment carried out by substrate cleaning apparatus 14, their descriptions are omitted here.

As shown in FIG. 8, in substrate cleaning apparatus (14A), a first-concentration alkali developing solution fed from first alkali developing solution supply source (45e) is supplied as a stripping-processing liquid from liquid supply device (40A) to a wafer (W) (step S201). Since the first-concentration alkali developing solution has a low concentration, the topcoat film is stripped from a wafer (W) with hardly any topcoat film being dissolved. Thus, the same as DIW used as a stripping-processing liquid, particles (P) are stripped from the wafer (W) along with the topcoat film.

In substrate cleaning apparatus (14A), a second-concentration alkali developing solution (>first concentration) fed from second alkali developing solution supply source (45f) is supplied as a stripping-processing liquid from liquid supply device (40A) to the wafer (W) (step S202). Since the second-concentration alkali developing solution has a higher concentration than that of the first-concentration alkali developing solution, the topcoat film is further stripped from the wafer (W) while being slightly dissolved.

In substrate cleaning apparatus (14A), a third-concentration alkali developing solution (>second concentration) fed from third alkali developing solution supply source (45g) is supplied as a dissolving-processing liquid from liquid supply device (40A) to the wafer (W) (step S203). Since the third-concentration alkali developing solution has a further higher concentration than that of the second-concentration alkali developing solution, the topcoat film stripped from the wafer (W) is dissolved at a higher dissolution level than by the second-concentration alkali developing solution.

Moreover, in substrate cleaning apparatus (14A), a fourth-concentration alkali developing solution (>third concentration) fed from fourth alkali developing solution supply source (45h) is supplied as a dissolving-processing liquid from liquid supply device (40A) to the wafer (W) (step S204). Since the fourth-concentration alkali developing solution has a further higher concentration than that of the third-concentration alkali developing solution, the topcoat film is further dissolved at a higher dissolution level than by the third-concentration alkali developing solution.

As described above, an alkali developing solution with a concentration lower than that of the alkali developing solution used in a dissolving-processing liquid supply process may be supplied to the topcoat film as a stripping-processing liquid. In such a case as well, the topcoat film is stripped from a wafer (W) the same as in the process where DIW is used as a stripping-processing liquid.

In substrate cleaning apparatus (14A) of the second embodiment, concentrations of alkali developing solutions used in a stripping-processing liquid supply process were changed from a lower concentration to a higher concentration within a range that does not exceed the concentration of an alkali developing solution used in the dissolving-processing liquid supply process. By so setting, since the topcoat film also dissolves while it is being stripped, the duration for substrate cleaning is shortened.

In substrate cleaning apparatus (14A) of the second embodiment, concentrations of alkali developing solutions used in a dissolving-processing liquid supply process were changed from a lower concentration to a higher concentration. By so setting, compared with a case when a high-concentration alkali developing solution as a dissolving-processing liquid is supplied without a preliminary step, the topcoat film is prevented from remaining on the wafer (W).

In the above stripping-processing liquid supply process, a first-concentration alkali developing solution was supplied first on the topcoat film. However, DIW may be supplied prior to the supply of the first-concentration alkali developing solution.

In the above stripping-processing liquid supply process and dissolving-processing liquid supply process, supply of alkali developing solutions was conducted in two steps. However, in a stripping-processing liquid supply process and a dissolving-processing liquid supply process, supply of alkali developing solutions may also be conducted in three or more steps. Alternatively, supply of alkali developing solutions in either a stripping-processing liquid supply process or a dissolving-processing liquid supply process may be conducted in a single step.

In the above, liquid supply device (40A) is connected to multiple supply sources (first alkali developing solution supply source (45e)~fourth alkali developing solution supply source (45h)), which supply alkali developing solutions of various different concentrations. However, it is an option for liquid supply device (40A) to be structured so as to be connected only to fourth alkali developing solution supply source (45h), which supplies a fourth-concentration alkali developing solution.

In such a structure, by supplying simultaneously from nozzle 41 both DIW and a fourth-concentration alkali developing solution, substrate cleaning apparatus (14A) can supply to a wafer (W) an alkali developing solution with a concentration lower than that of the fourth-concentration alkali developing solution. Substrate cleaning apparatus (14A) can supply first- to fourth-concentration alkali developing solutions to a wafer (W) by adjusting the feed amount of DIW.

In the above, alkali developing solutions with their respective concentrations are used as a stripping-processing liquid and dissolving-processing liquid. However, IPA solutions (mixed solution of IPA and pure water) with different concentrations may also be used. In such a case, low-concentration IPA solutions for a stripping-processing liquid supply process and high-concentration IPA solutions for a dissolving-processing liquid supply process are supplied in steps.

Third Embodiment

Figure 9:
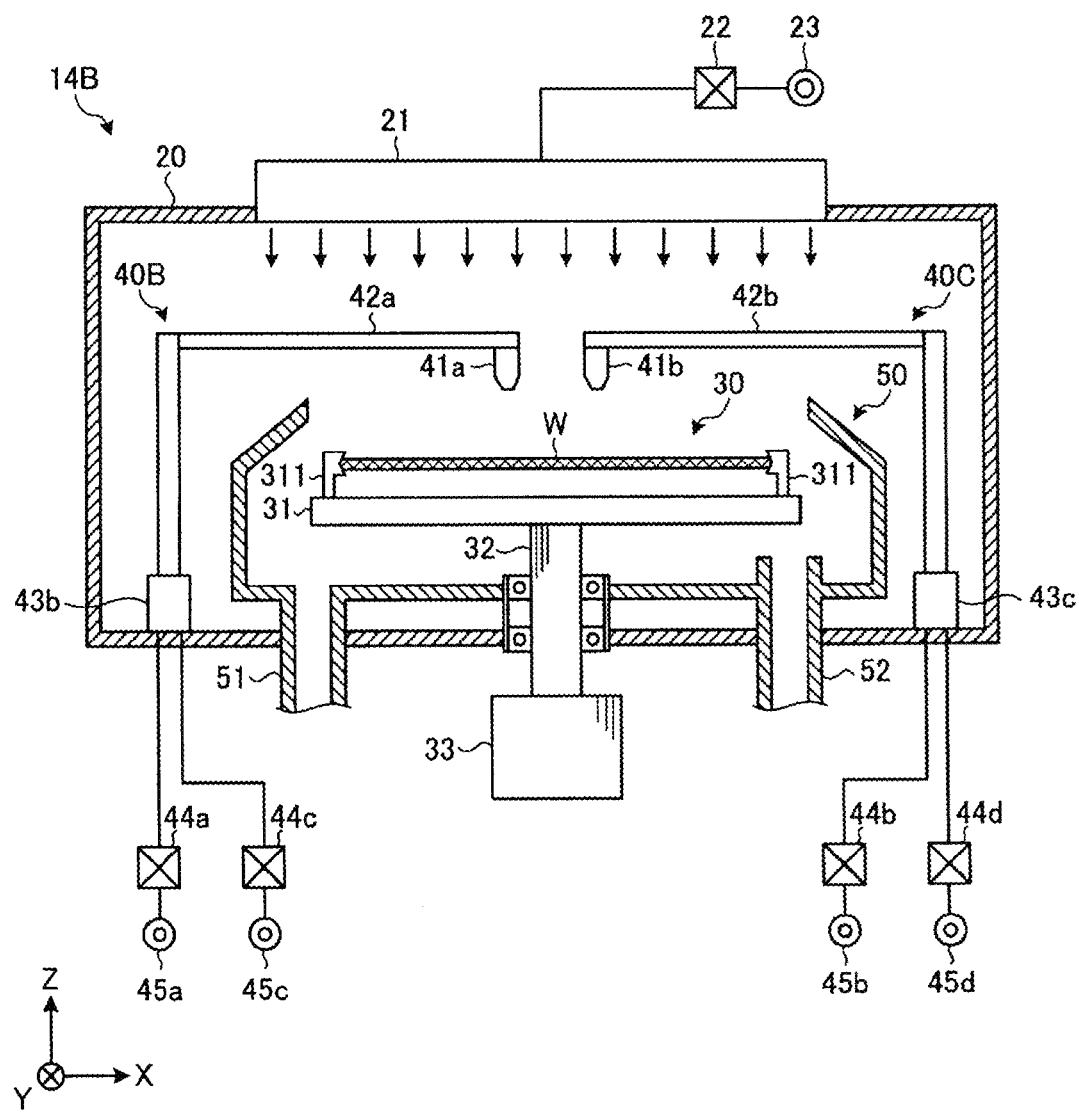
FIG. 9 is a view schematically showing the structure of a substrate cleaning apparatus according to a third embodiment.

In the above embodiments, multiple processing liquids such as a topcoat solution and an alkali developing solution are supplied from nozzle 41 provided on one arm. However, a substrate cleaning apparatus may have nozzles provided on multiple arms. In the following, an example in which a substrate cleaning apparatus having nozzles provided on multiple arms is described with reference to FIG. 9. FIG. 9 is a view schematically showing the structure of a substrate cleaning apparatus according to a third embodiment.

As shown in FIG. 9, substrate cleaning apparatus (14B) according to the third embodiment has first liquid supply device (40B) and second liquid supply device (40C).

First liquid supply device (40B) has nozzle (41a), arm (42a) to horizontally support nozzle (41a), and rotatable elevator mechanism (43b) to rotate, elevate and lower arm (42a). Also, second liquid supply device (40C) has nozzle (41b), arm (42b) to horizontally support nozzle (41b) and rotatable elevator mechanism (43c) to rotate, elevate and lower arm (42b).

Nozzle (41a) of first liquid supply device (40B) is connected to ozone water supply source (45a) and DIW supply source (45c) via valves (44a, 44c) respectively. Nozzle (41b) of second liquid supply device (40C) is connected to topcoat solution supply source (45b) and alkali developing solution supply source (45d) via valves (44b, 44d) respectively.

Substrate cleaning apparatus (14B) may also supply ozone water, topcoat solution, DIW and alkali developing solutions by allocating them to nozzles (41a, 41b) of multiple arms.

To change concentrations of alkali developing solutions as in substrate cleaning apparatus (14A) of the second embodiment, DIW is supplied from nozzle (41a) of first liquid supply device (40B) while an alkali developing solution is supplied from nozzle (41b) of second liquid supply device (40C). In such a case, an alkali developing solution and DIW are mixed on a wafer (W) so as to form a low-concentration alkali developing solution on the wafer (W).

In the above, substrate cleaning apparatus (14B) is set to have two liquid supply devices (first liquid supply device (40B) and second liquid supply device (40C)). However, multiple nozzles may be provided for one liquid supply device.

Fourth Embodiment

When pure water at normal temperature is used as a stripping-processing liquid, the topcoat film may not be fully stripped depending on the type of a base layer on the wafer surface, and particle removal effects may not be fully achieved. For example, if pure water at normal temperature is used as a stripping-processing liquid when an SiN wafer with an SiN (silicon nitride) film formed on its surface is set as a target substrate, it is found that the topcoat film will not be fully stripped. To solve such a problem, an example is described where heated pure water is used as a stripping-processing liquid in a fourth embodiment.

Figure 10:
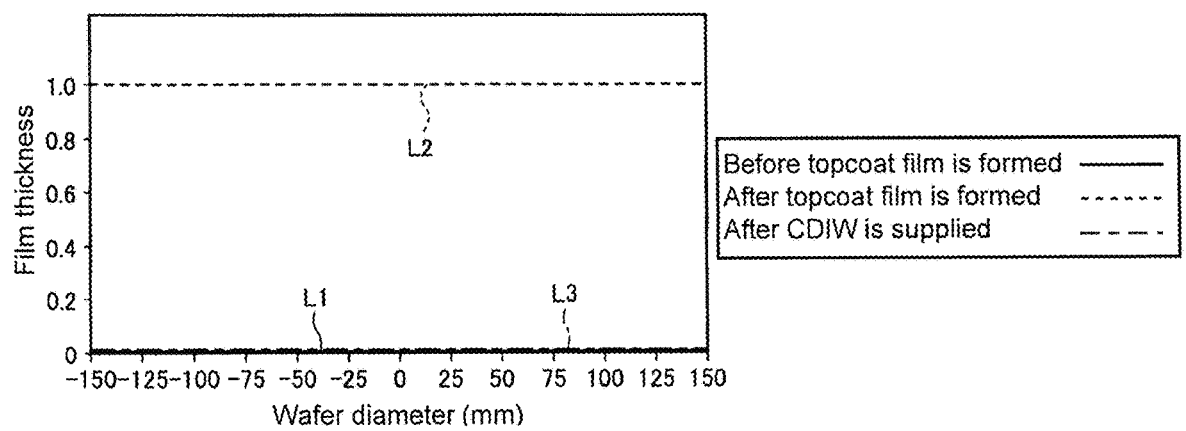
FIG. 10 is a graph showing a change in the film thickness when pure water at normal temperature is supplied to a topcoat film formed on a bare silicon wafer.

The strippability of the topcoat film formed on a bare silicon wafer is described with reference to FIG. 10. FIG. 10 shows change in film thickness when pure water at normal temperature is supplied to the topcoat film on a bare silicon wafer.

The horizontal axis of the graph in FIG. 10 indicates the position on a bare silicon wafer (wafer diameter); the central position of a bare silicon wafer with a diameter of 150 mm is set at 0, and the positions of both ends are set at −150 and 150 respectively. Also, the vertical axis of the graph in FIG. 10 shows the film thickness of a topcoat film, and the values indicate the ratio of each film thickness in relation to the film thickness after a topcoat film is formed. In FIG. 10, solid line (L1) indicates the film thickness before a topcoat film is formed, broken line (L2) indicates the film thickness after a topcoat film is formed, and chain line (L3) indicates the film thickness after pure water at normal temperature is supplied. Here, pure water at normal temperature (hereinafter referred to as "CDIW") indicates pure water at 23° C., for example.

As shown in FIG. 10, the film thickness after CDIW is supplied (chain line (L3)) substantially corresponds to the film thickness before the topcoat film is formed (solid line (L1)). Namely, a topcoat film formed on a bare silicon wafer is well stripped by CDIW.

Figure 11:
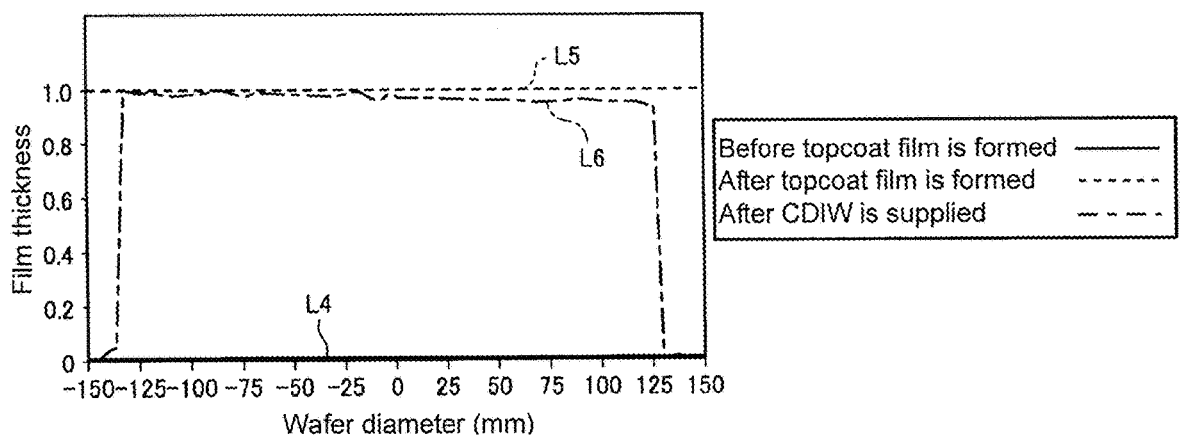
FIG. 11 is a graph showing a change in the film thickness when pure water at normal temperature is supplied to a topcoat film on an SiN wafer.
Figure 12:
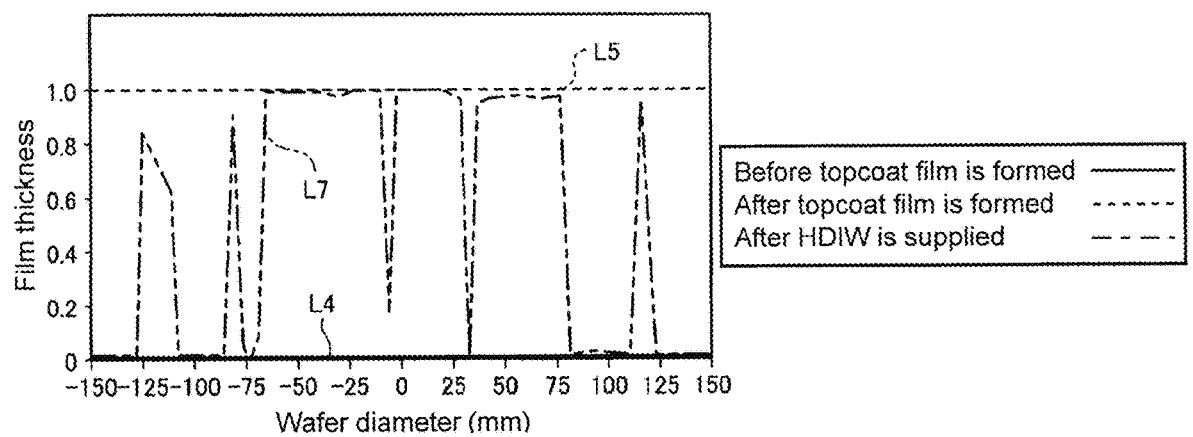
FIG. 12 is a graph showing a change in the film thickness when heated pure water is supplied to a topcoat film on an SiN wafer.

The strippability of a topcoat film on an SiN wafer is described with reference to FIGS. 11 and 12. FIG. 11 is a graph showing change in film thickness when pure water at normal temperature is supplied to a topcoat film on an SiN wafer. Also, FIG. 12 is a graph showing change in film thickness when heated pure water is supplied to a topcoat film on an SiN wafer.

In FIG. 11, solid line (L4) indicates the film thickness before a topcoat film is formed, broken line (L5) indicates the film thickness after a topcoat film is formed, and chain line (L6) indicates the film thickness after pure water at normal temperature is supplied. Moreover, in addition to (L4, L5), two-dot chain line (L7) in FIG. 12 indicates the film thickness on an SiN wafer after heated pure water is supplied. Here, heated pure water (hereinafter referred to as "HDIW") indicates pure water heated to 75° C., for example. Also, an SiN wafer means a wafer with an SiN film formed on a bare silicon wafer, for example.

As shown in FIG. 11, only in the peripheral portion of the SiN wafer, the film thickness after CDIW is supplied (chain line (L6)) substantially corresponds to the film thickness of an SiN wafer before the topcoat film is formed (solid line (L4)). Namely, when an SiN wafer is a processing target and if CDIW is used as a stripping-processing liquid, the topcoat film remains on the SiN wafer.

When an SiN wafer is a processing target, the strippability of a topcoat film is lower than when a bare silicon wafer is a processing target. One of the reasons is thought to be that the topcoat film is chemically bonded with the SiN film and such a bonding makes it harder for pure water to reach the interface of the topcoat film and the SiN wafer. In the example described here, the topcoat film was observed to be stripped from the peripheral portion of an SiN wafer because pure water infiltrates the interface between a beveled portion of the SiN wafer and the topcoat film.

On the other hand, as shown in FIG. 12, the film thickness of an SiN wafer after HDIW is supplied (two-dot chain line (L7)) corresponds to the film thickness (solid line (L4)) before the topcoat film is formed in more portions than when CDIW was used as a stripping-processing liquid (chain line (L6), see FIG. 11). Namely, when HDIW is used as a stripping-processing liquid, the strippability of a topcoat film is greater than when CDIW is used.

When an SiN wafer is a processing target, the strippability of a topcoat film is improved by using HDIW as a stripping-processing liquid.

However, even when HDIW is used as a stripping-processing liquid, the topcoat film still remains on the SiN wafer as shown in FIG. 12. Especially, more topcoat film remains in the central portion than in the peripheral portion of the SiN wafer. Thus, the following describes an example of an HDIW supply method that is capable of further improving the strippability of a topcoat film.

Figure 13:
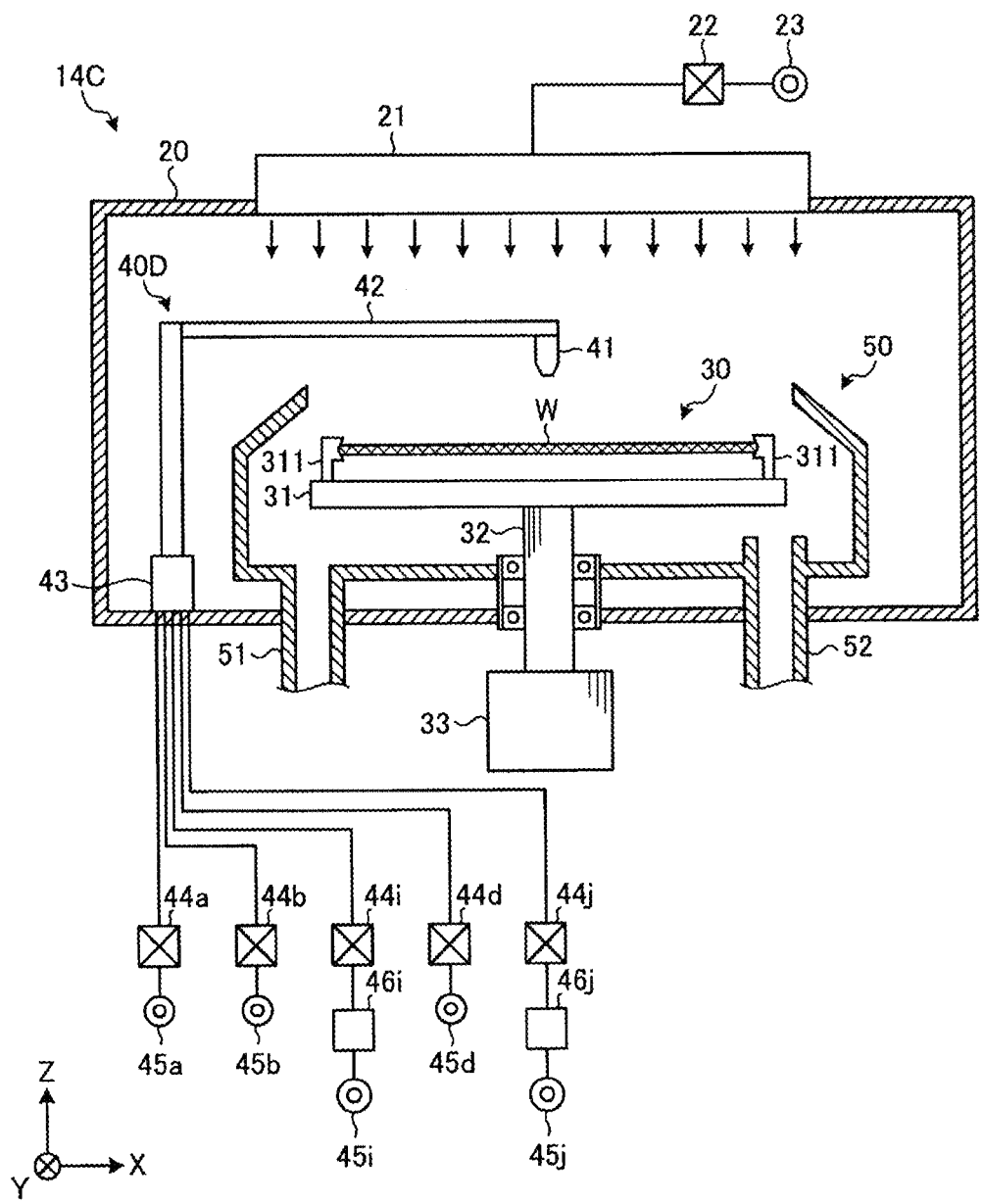
FIG. 13 is a view schematically showing the structure of a substrate cleaning apparatus according to a fourth embodiment.

FIG. 13 is a view schematically showing the structure of a substrate cleaning apparatus according to the fourth embodiment. Substrate cleaning apparatus (14C) of the fourth embodiment has liquid supply device (40D) as shown in FIG. 13. Liquid supply device (40D) is connected to supply source (45i) of DIW for stripping processing via valve (44i) and heater (46i). In addition, liquid supply device (40D) is connected to supply source (45j) of DIW for rinsing treatment via valve (44j) and heater (46j).

DIW supplied from supply source (45i) of DIW for stripping processing is pure water at normal temperature to be used for stripping processing. Here, pure water at normal temperature supplied from supply source (45i) of DIW for stripping processing is heated to 75° C. by heater (46i), and the heated pure water (HDIW) is supplied via valve (44i). Also, DIW supplied from supply source (45j) of DIW for rinsing treatment is pure water at normal temperature to be used for rinsing treatment. In the example described here, pure water at normal temperature supplied from supply source (45j) of DIW for rinsing treatment is heated by heater (46j) to a temperature lower than 75° C., for example, 50° C., and the heated pure water (HDIW) is supplied via valve (44j).

Substrate cleaning apparatus (14C) has supply source (45i) of DIW for stripping processing to supply DIW as a stripping-processing liquid, in addition to supply source (45j) of DIW for rinsing treatment to supply DIW as a rinsing-treatment liquid. In the example described here, HDIW for stripping and HDIW for rinsing, which are heated by heaters (46i, 46j) respectively, are discharged from a single nozzle 41. However, substrate cleaning apparatus (14C) may have a nozzle to discharge HDIW for stripping processing and another nozzle to discharge HDIW for rinsing treatment.

The temperature of HDIW for stripping processing may be set the same as that of HDIW for rinsing treatment. In addition, CDIW may be used for rinsing treatment instead of HDIW.

Figure 14:
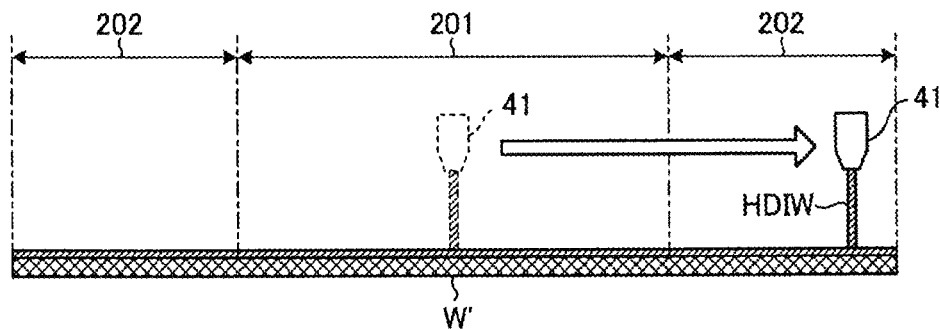
FIG. 14 is a view showing an example of performing a stripping-processing liquid supply process according to the fourth embodiment.

An example of performing a stripping-processing liquid supply process using the above substrate cleaning apparatus (14C) is described with reference to FIG. 14. FIG. 14 shows an example of performing a stripping-processing liquid supply process according to the fourth embodiment.

As shown in FIG. 14, substrate cleaning apparatus (14C) moves nozzle 41 by using rotatable elevator mechanism 43 from the central portion of an SiN wafer (W') toward the periphery while supplying HDIW to the topcoat film on the SiN wafer (W').

Liquid supply device (40D) (corresponding to an example of a "stripping-processing liquid supply device") has nozzle 41 to supply HDIW and rotatable elevator mechanism 43 (corresponding to an example of a "moving mechanism") to move nozzle 41. Then, substrate cleaning apparatus (14C) supplies HDIW from nozzle 41 to the topcoat film while moving nozzle 41 by using rotatable elevator mechanism 43.

When such a scanning operation is conducted, an impact is exerted on the topcoat film, resulting in weaker bonding of the topcoat film and the SiN film. Accordingly, it is easier for HDIW to reach the interface of the topcoat film and the SiN wafer (W'), and the strippability of the topcoat film is thereby improved.

In the fourth embodiment, "impact" indicates a level of impact that does not cause pattern collapse. Thus, there is no risk of pattern collapse when stripping processing is conducted as described in the fourth embodiment.

Substrate cleaning apparatus (14C) may move nozzle 41 while scanning from the central portion to the outermost peripheral portion of an SiN wafer (W'). However, it is an option to scan remaining region 201, which includes the central portion of the SiN wafer (W') where most of the remaining topcoat film is observed. By so setting, duration for a stripping-processing liquid supply process is shortened. The range for remaining region 201 is determined based on the graph shown in FIG. 11. For example, remaining region 201 may be set in a range of −85~85 mm.

In substrate cleaning apparatus (14C), the scanning speed of nozzle 41 in remaining region 201 may be set different from that in strippable region 202, which includes the peripheral portion of an SiN wafer (W') where the strippability of the topcoat film is excellent. For example, compared with the scanning speed of nozzle 41 in strippable region 202, the scanning speed of nozzle 41 in remaining region 201 may be set higher in substrate cleaning apparatus (14C). When the scanning speed is set higher, the number of impacts exerted on the topcoat film per unit time increases, and the strippability of the topcoat film is further improved in remaining region 201.

In the above example, nozzle 41 was moved from the center of an SiN wafer (W') toward the periphery. However, it is an option for substrate cleaning apparatus (14C) to move nozzle 41 from the periphery of an SiN wafer (W') toward the center.

While HDIW is supplied, the rotation rate of a wafer (W) may be set higher than the rate while other processing is conducted. For example, the rotation rate is set at 1000 rpm during a film-forming liquid supply process whereas the rate may be set at 1500 rpm during the supply of HDIW. Accordingly, the stripped processing film is promptly spun off from the wafer (W), making it easier for HDIW to infiltrate the remaining processing film, and the stripping process is thereby facilitated.

Figure 15:
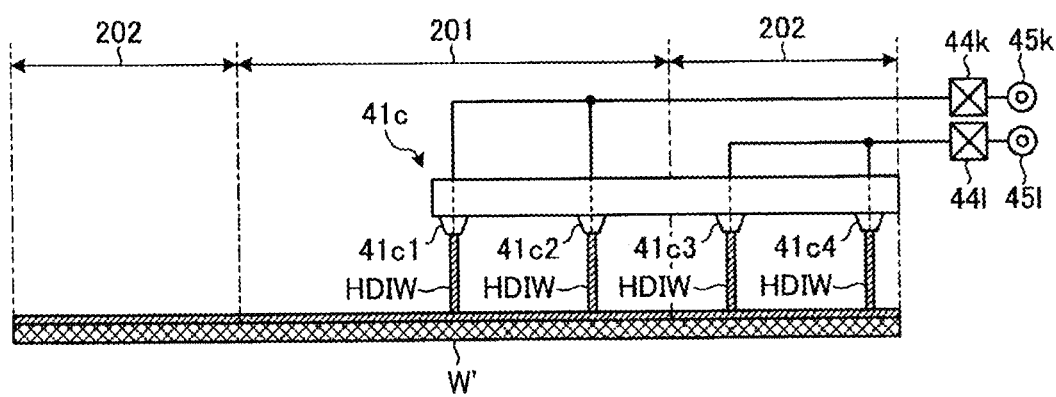
FIG. 15 is a view showing an example of performing a stripping-processing liquid supply process according to a first modified example of the fourth embodiment.

A first modified example of the stripping-processing liquid supply process of the fourth embodiment is described with reference to FIG. 15. FIG. 15 is a view showing an example of performing a stripping-processing liquid supply process according to the first modified example of the fourth embodiment.

As shown in FIG. 15, a stripping-processing liquid supply process may be conducted by using a bar nozzle (41c). Bar nozzle (41c) is a rod type nozzle extending in a diameter direction of an SiN wafer (W'), for example, and has multiple (four in this example) discharge openings (41c1~41c4) in its lower portion. Discharge openings (41c1~41c4) have the same opening diameter as each other and are positioned side by side at predetermined intervals along a long side of bar nozzle (41c), for example. Bar nozzle (41c) is supported by arm 42 (see FIG. 13), for example.

Among discharge openings (41c1~41c4) of bar nozzle (41c), discharge openings (41c1, 41c2) are positioned facing remaining region 201 of an SiN wafer (W'), and discharge openings (41c3, 41c4) are positioned facing strippable region 202. In addition, first HDIW supply source (45k) is connected to discharge openings (41c1, 41c2) via valve (44k), and second HDIW supply source (45l) is connected to discharge openings (41c3, 41c4) via valve (44l). Alternatively, it is an option to connect discharge openings (41c1, 41c2) to the first DIW supply source via valve (44k) and the first heater; and to connect discharge openings (41c3, 41c4) to the second DIW supply source via valve (44l) and the second heater.

Bar nozzle (41c) structured as above supplies HDIW fed from first HDIW supply source (45k) to remaining region 201 of an SiN wafer (W') through discharge openings (41c1, 41c2). Also, bar nozzle (41c) supplies HDIW fed from second HDIW supply source (45l) to strippable region 202 of the SiN wafer (W') through discharge openings (41c3, 41c4).

Regarding bar nozzle (41c), the feed rate of HDIW fed from first HDIW supply source (45k) to discharge openings (41c1, 41c2) is set greater than that from second HDIW (45l) to discharge openings (41c3, 41c4). Thus, the flow rate of HDIW from discharge openings (41c1, 41c2) to remaining region 201 is higher than that of HDIW from discharge openings (41c3, 41c4) to strippable region 202. By so setting, since the impact on the topcoat film in remaining region 201 is stronger than that on the topcoat film in strippable region 202, the strippability of the topcoat film in remaining region 201 is improved.

Liquid supply device (40D) (corresponding to an example of a "stripping-processing liquid supply device") is provided with bar nozzle (41c) having multiple discharge openings (41c1~41c4) positioned side by side along a diameter direction of an SiN wafer (W') at predetermined intervals. Compared with the flow rate of HDIW from discharge openings (41c3, 41c4) arranged to face strippable region 202, which includes the peripheral portion of the SiN wafer (W'), the flow rate of HDIW from discharge openings (41c1, 41c2) arranged to face remaining region 201, which includes the central portion of the SiN wafer (W'), is set higher in liquid supply device (40D). Accordingly, the strippability of the topcoat film in remaining region 201 is enhanced.

Discharge openings (41c1~41c4) are set to have the same opening diameter, and the feed rate of HDIW supplied to discharge openings (41c1, 41c2) is set greater than that supplied to discharge openings (41c3, 41c4). However, those settings are not the only options. The feed rates of HDIW to discharge openings (41c1~41c4) may be set the same, and the opening diameter of discharge openings (41c1, 41c2) may be set smaller than that of discharge openings (41c3, 41c4). In such settings as well, the flow rate of HDIW from discharge openings (41c1, 41c2) to remaining region 201 is set higher than that from discharge openings (41c3, 41c4) to strippable region 202.

Figure 16:
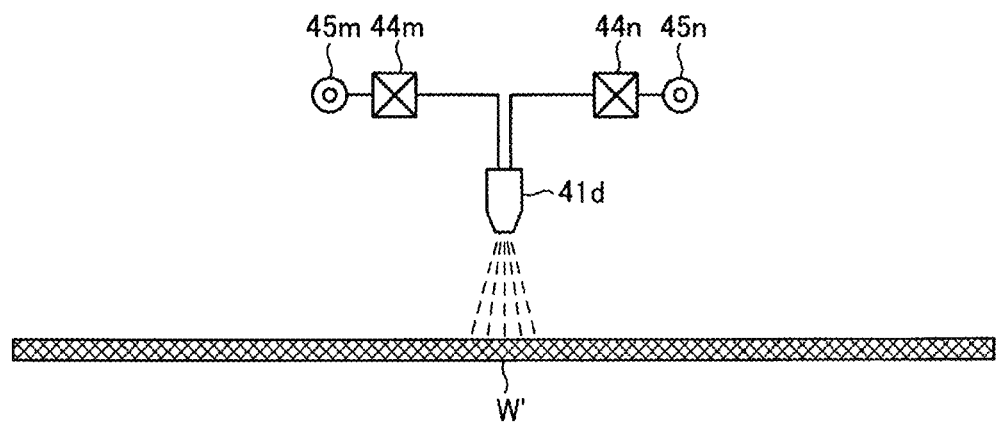
FIG. 16 is a view showing an example of performing a stripping-processing liquid supply process according to a second modified example of the fourth embodiment.

A second modified example of the stripping-processing liquid supply process of the fourth embodiment is described with reference to FIG. 16. FIG. 16 is a view showing an example of a stripping-processing liquid supply process performed according to the second modified example of the fourth embodiment.

As shown in FIG. 16, nozzle (41d) of the second modified example is a two-fluid nozzle, and is connected to HDIW supply source (45m) via valve (44m) as well as to gas supply source (45n) via valve (44n). An inactive gas such as nitrogen is supplied from gas supply source (45n). Nozzle (41d) may be provided to arm 42 separate from nozzle 41 shown in FIG. 13, or to arm 42 instead of nozzle 41. Also, nozzle (41d) may be connected to a DIW supply source via valve (44m) and a heater.

HDIW and an inactive gas supplied to nozzle (41d) are mixed in nozzle (41d) and supplied to the topcoat film on an SiN wafer (W') from nozzle (41d). When two-fluid nozzle (41d) is used in a stripping-processing liquid supply process, impact is exerted on a topcoat film by the mixed fluid discharged from nozzle (41d), and the strippability of the topcoat film is thereby improved.

Figure 17:
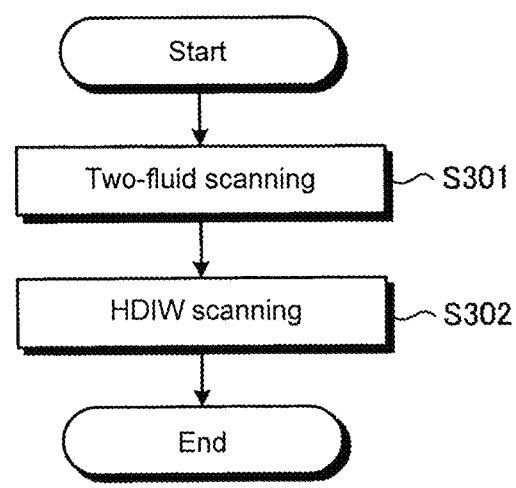
FIG. 17 is a flowchart showing procedures for a substrate cleaning processing carried out by a substrate cleaning apparatus of the fourth embodiment.

Specific procedures for a stripping-processing liquid supply process using two-fluid nozzle (41d) are described with reference to FIG. 17. FIG. 17 is a flowchart showing the procedures for a stripping-processing liquid supply process according to the second modified example of the fourth embodiment.

As shown in FIG. 17, in the stripping-processing liquid supply process of the second modified example, a two-fluid scanning processing is first conducted (step S301), followed by an HDIW scanning processing (step S302). The two-fluid scanning processing is conducted by moving nozzle (41d) from the central portion of an SiN wafer (W') toward the periphery while supplying a mixed fluid of HDIW and an inactive gas from nozzle (41d) to the topcoat film on the SiN wafer (W'). The HDIW scanning processing is conducted by moving nozzle (41d) from the central portion of the SiN wafer (W') toward the periphery while supplying only HDIW to the topcoat film of the SiN wafer (W') from nozzle (41d).

Since a two-fluid scanning processing exerts a relatively strong impact on the topcoat film on an SiN wafer (W'), pattern collapse may occur. Thus, in a stripping-processing liquid supply process of the second modified example, the time is set short for a two-fluid scanning processing, and then an HDIW scanning processing is conducted. Accordingly, pattern collapse is prevented and the strippability of the topcoat film is improved. Here, the duration for two-fluid scanning is set shorter than that for HDIW scanning. Also, such duration is set so that HDIW fully infiltrates the topcoat film, but the film stripping itself will not begin.

Liquid supply device (40D) (corresponding to an example of a "stripping-processing liquid supply device") has two-fluid nozzle (41d). Liquid supply device (40D) supplies a mixed fluid from nozzle (41d) to a topcoat film, and then supplies HDIW from nozzle (41d) to the topcoat film. Accordingly, the strippability of the topcoat film is improved.

The two-fluid scanning processing and HDIW scanning processing may be conducted only on remaining region 201. Alternatively, it is an option to conduct a two-fluid scanning processing only on remaining region 201, and to conduct an HDIW scanning processing on both remaining region 201 and strippable region 202. Conversely, it is another option to conduct a two-fluid scanning processing both on remaining region 201 and strippable region 202, and to conduct an HDIW scanning processing only on remaining region 201.

To suppress the impact of a two-fluid scanning processing, the distance between nozzle (41d) and an SiN wafer (W') during a two-fluid scanning processing may be set greater than the distance between nozzle (41d) and the SiN wafer (W') during an HDIW scanning processing.

In the above example, nozzle (41d) discharged a mixed fluid of HDIW and an inactive gas. However, the mixed fluid discharged from nozzle (41d) may be a mixed fluid of a fluid other than HDIW and a gas other than an inactive gas.

In the fourth embodiment, an SiN wafer (W') was used as a target wafer. However, when any wafer other than an SiN wafer (W') is a target, strippability also improves by using heated pure water as a stripping-processing liquid.

Other Embodiments

In the above-described first through fourth embodiments, a film-forming liquid supply process and a dissolving-processing liquid supply process were conducted in the same chamber. However, a film-forming liquid supply process and a dissolving-processing liquid supply process may be conducted in separate chambers. In such a setting, for example, it is an option to position in processing station 3 shown in FIG. 2 both a first substrate cleaning apparatus to conduct step (S101) (substrate loading process) through step (S104) (drying process) shown in FIG. 4 and a second substrate cleaning apparatus to conduct step (S105) (stripping-processing liquid supply process) through step (S109) (substrate unloading process) shown in FIG. 4. Alternatively, a stripping-processing liquid supply process and a dissolving-processing liquid supply process may be conducted in separate chambers. Also, a first substrate cleaning apparatus may be set in a separate processing station; for example, after the film-forming liquid supply process is conducted, a wafer (W) is placed in carrier mounting section 11 and a dissolving-processing liquid supply process may be conducted in a second substrate cleaning apparatus set in processing station 3.

In the above-described first and third embodiments, liquid DIW was used as a stripping-processing liquid. However, mist DIW may be used as a stripping-processing liquid.

In each embodiment described above, DIW was directly supplied to a topcoat film by using a nozzle. However, DIW may be indirectly supplied to a topcoat film by increasing the humidity in a chamber by using a humidifier or the like.

In each embodiment described above, a topcoat solution was used as a film-forming liquid and DIW or a low-concentration alkali developing solution was used as a stripping-processing liquid. However, a film-forming liquid and a stripping-processing liquid are not limited to any specific combination as long as a combination of liquids allows a stripping process without causing a processing film formed on a wafer (W) to dissolve (or before the film dissolves). For example, it is sufficient if a stripping-processing liquid contains at least one of the following: $CO_2$ water (DIW with $CO_2$ gas mixed in), acidic or alkaline solution, solution with a surfactant, fluorine-based solvent such as hydrofluoroether (HFE), and diluted IPA (isopropyl alcohol (IPA) diluted by pure water).

When a topcoat solution is used as a film-forming liquid, a substrate cleaning apparatus may supply to a wafer a solvent having affinity with a topcoat solution, for example, MIBC (4-methyl-2-pentanol), prior to conducting a film-forming liquid supply process. MIBC is contained in a topcoat solution and has affinity with the topcoat solution. As a solvent having affinity with a topcoat solution, for example, PGME (propylene glycol monomethyl ether), PGMEA (propylene glycol monomethyl ether acetate) or the like may be used instead of MIBC.

By coating MIBC, which has affinity with a topcoat solution, on a wafer (W) in advance, the topcoat solution tends to spread well over the upper surface of the wafer (W) and infiltrate spaces among patterns in a later film-forming liquid supply process. Thus, the feed amount of a topcoat solution is reduced and particles (P) located among patterns are more certainly removed. Also, the duration for a film-forming liquid supply process is shortened.

In each embodiment described above, an alkali developing solution was used in a dissolving-processing liquid supply process. However, a dissolving-processing liquid may be prepared by adding hydrogen peroxide to an alkali developing solution. By adding hydrogen peroxide to an alkali developing solution, surface roughness of the wafer surface caused by an alkali developing solution is suppressed.

A dissolving-processing liquid may be an organic solvent such as MIBC (4-methyl-2-pentanol), thinner, toluene, acetate, alcohol, glycol (propylene glycol monomethyl ether) or the like, or an acidic developing solution based on acetic acid, formic acid, hydroxyacetic acid or the like.

A dissolving-processing liquid may contain a surfactant. Since a surfactant weakens surface tension, it is capable of suppressing particles (P) from reattaching to a wafer (W) or the like. Also, unwanted substances as targets to be removed are not limited to particles, for example, they may be other substances such as a polymer remaining on a substrate after dry etching or ashing.

By employing a method using physical force, it is difficult to remove unwanted substances such as polymers and particles having a small diameter.

By employing a method using chemical reactions of a chemical solution, the surface of a substrate may be affected through adverse effects such as erosion of the base layer of a substrate caused by etching or the like.

However, by employing a substrate cleaning method, a substrate cleaning system and a memory medium according to embodiments of the present invention, smaller-diameter unwanted substances attached to a substrate are removed without adversely affecting the surface of the substrate.

A substrate cleaning method according to an embodiment of the present invention includes a film-forming liquid supply process, a stripping-processing liquid supply process and a dissolving-processing liquid supply process. The film-forming liquid supply process provides a substrate with a film-forming liquid that contains a volatile component and forms a film on the substrate. The stripping-processing liquid supply process provides a stripping-processing liquid onto a processing film formed by the film-forming liquid, which has solidified or cured on the substrate when the volatile component was vaporized, so that the processing film is stripped from the substrate. The dissolving-processing liquid supply process provides a dissolving-processing liquid to the processing film so that the processing film dissolves after the stripping-processing liquid supply step has been conducted.

According to an embodiment of the present invention, smaller-diameter unwanted substances attached to a substrate are removed without adversely affecting the surface of the substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A method for cleaning a substrate, comprising:
   supplying to a substrate on which a resist layer is not formed a film-forming processing liquid which includes a volatile component and forms a film on the substrate;
   forming a processing film on the substrate by solidifying or curing the film-forming processing liquid supplied on the substrate;
   supplying to the substrate having the processing film a strip processing liquid which strips the processing film from the substrate such that the strip-processing liquid infiltrates the processing film and reaches an interface between the substrate and the processing film and that the processing film is dissolved and stripped in a film state from the substrate; and
   supplying a dissolving-processing liquid which dissolves the processing film to the substrate such that the processing film stripped in the film state from the substrate is dissolved on the substrate,
   wherein the strip-processing liquid is pure water, and the dissolving-processing liquid comprises an alkali developing solution.

2. The method for cleaning a substrate according to claim 1, wherein the substrate has a surface having a pattern formed on the surface of the substrate, and the supplying of the film-forming processing liquid comprises supplying the film-forming processing liquid to the surface having the pattern.

3. The method for cleaning a substrate according to claim 2, wherein the forming of the processing film comprises solidifying or curing the film-forming processing liquid such that strain is generated by volume contraction of the processing film and strips particles attached to the pattern on the surface of the substrate from the pattern.

4. The method for cleaning a substrate according to claim 1, wherein the supplying of the strip-processing liquid comprises a plurality of supplying steps.

5. The method for cleaning a substrate according to claim 1, wherein the pure water is heated pure water.

6. The method for cleaning a substrate according to claim 4, wherein the supplying of the strip-processing liquid includes supplying the pure water in one step and supplying a second strip-processing liquid comprising an alkaline solution in another step.

7. The method for cleaning a substrate according to claim 4, wherein the supplying of the strip-processing liquid includes supplying the pure water in one step and supplying a second strip-processing liquid comprising a developing solution including ammonia in another step.

8. The method for cleaning a substrate according to claim 4, wherein the substrate has a surface having a pattern formed on the surface of the substrate, and the supplying of the film-forming processing liquid comprises supplying the film-forming processing liquid to the surface having the pattern.

9. The method for cleaning a substrate according to claim 8, wherein the forming of the processing film comprises solidifying or curing the film-forming processing liquid such that strain is generated by volume contraction of the processing film and strips particles attached to the pattern on the surface of the substrate from the pattern.

10. The method for cleaning a substrate according to claim 2, wherein the supplying of the strip-processing liquid comprises a plurality of supplying steps.

11. The method for cleaning a substrate according to claim 2, wherein the pure water is heated pure water.

12. The method for cleaning a substrate according to claim 10, wherein the supplying of the strip-processing liquid includes supplying the pure water in one step and supplying a second strip-processing liquid comprising an alkaline solution in another step.

13. The method for cleaning a substrate according to claim 10, wherein the supplying of the strip-processing liquid includes supplying the pure water in one step and supplying a second strip-processing liquid comprising a developing solution including ammonia in another step.

14. The method for cleaning a substrate according to claim 3, wherein the supplying of the strip-processing liquid comprises a plurality of supplying steps.

15. The method for cleaning a substrate according to claim 3, wherein the pure water is heated pure water.

16. The method for cleaning a substrate according to claim 14, wherein the supplying of the strip-processing liquid includes supplying the pure water in one step and supplying a second strip-processing liquid comprising an alkaline solution in another step.

17. A non-transitory computer readable medium including a program for controlling a substrate cleaning system, which when executed by a processor of the substrate cleaning system, the program controls the substrate cleaning system to execute the method for cleaning a substrate according to claim 1.

18. A method for cleaning a substrate, comprising:
   supplying to a substrate on which a resist layer is not formed a film-forming processing liquid which includes a volatile component and forms a film on the substrate;

forming a processing film on the substrate by solidifying or curing the film-forming processing liquid supplied on the substrate;

supplying to the substrate having the processing film a strip-processing liquid which strips the processing film from the substrate such that the strip-processing liquid infiltrates the processing film and reaches an interface between the substrate and the processing film and that the processing film is dissolved and stripped in a film state from the substrate; and supplying a dissolving-processing liquid which dissolves the processing film to the substrate such that the processing film stripped in the film state from the substrate is dissolved on the substrate, wherein the dissolving-processing liquid comprises an alkali developing solution, and the strip-processing liquid comprises an alkali developing solution having a concentration that is lower than a concentration of the alkali developing solution of the dissolving-processing liquid.

19. The method for cleaning a substrate according to claim 18, wherein the substrate has a surface having a pattern formed on the surface of the substrate, and the supplying of the film-forming processing liquid comprises supplying the film-forming processing liquid to the surface having the pattern.

20. The method for cleaning a substrate according to claim 19, wherein the forming of the processing film comprises solidifying or curing the film-forming processing liquid such that strain is generated by volume contraction of the processing film and strips particles attached to the pattern on the surface of the substrate from the pattern.

* * * * *